(12) United States Patent
Akiyama et al.

(10) Patent No.: US 7,088,423 B2
(45) Date of Patent: Aug. 8, 2006

(54) EDGE EXPOSING APPARATUS

(75) Inventors: Kazuya Akiyama, Kyoto (JP); Kenji Kamei, Kyoto (JP); Kazuya Ono, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 25 days.

(21) Appl. No.: 10/945,652

(22) Filed: Sep. 21, 2004

(65) Prior Publication Data
US 2005/0062951 A1 Mar. 24, 2005

(30) Foreign Application Priority Data
Sep. 22, 2003 (JP) ............................. 2003-329927

(51) Int. Cl.
*G03B 27/42* (2006.01)
*G03B 27/54* (2006.01)
(52) U.S. Cl. .......................................... 355/53; 355/67
(58) Field of Classification Search ................. 355/53, 355/67–71; 250/548; 430/315
See application file for complete search history.

(56) References Cited

U.S. PATENT DOCUMENTS

| | | | | |
|---|---|---|---|---|
| 4,048,486 A | * | 9/1977 | Kriege | 362/554 |
| 4,899,195 A | * | 2/1990 | Gotoh | 355/77 |
| 5,204,224 A | * | 4/1993 | Suzuki | 430/315 |
| 5,929,976 A | * | 7/1999 | Shibuya et al. | 355/53 |
| 6,002,466 A | * | 12/1999 | Brauch et al. | 355/53 |

FOREIGN PATENT DOCUMENTS

| | | |
|---|---|---|
| JP | 1-243427 | 9/1989 |
| JP | 7-183207 | 7/1995 |
| JP | 2002-313708 | * 10/2002 |

* cited by examiner

*Primary Examiner*—Henry Hung Nguyen
(74) *Attorney, Agent, or Firm*—Ostrolenk, Faber, Gerb & Soffen, LLP

(57) ABSTRACT

An edge exposing apparatus includes a photo detector and a lighting time measuring circuit for detecting a decrease in performance of light source units. The lighting time measuring circuit detects a ready state ((stabilization of luminous intensity) of the light source units, for example by measuring a lighting time for a startup (switch-on) of the light source units. When the measuring circuit detects a preset lighting time, or when the photo detector detects a luminous intensity below a preset value, the light source units are determined to have lowered performance, and are switched off. When a decrease in performance of one unit is detected, a replacement light source unit is started while continuing edge exposure with one or more other light source unit(s). When a ready state is detected, the edge exposure with the one light source unit is terminated (switch-off), and edge exposure is performed with the replacement light source unit.

19 Claims, 18 Drawing Sheets

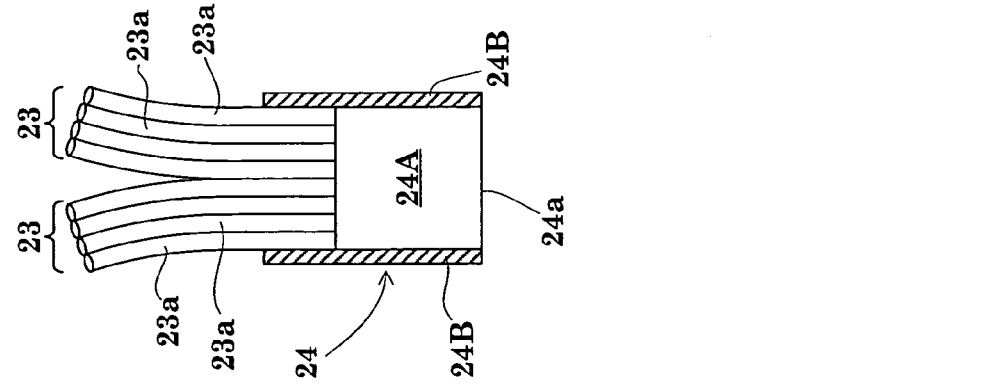
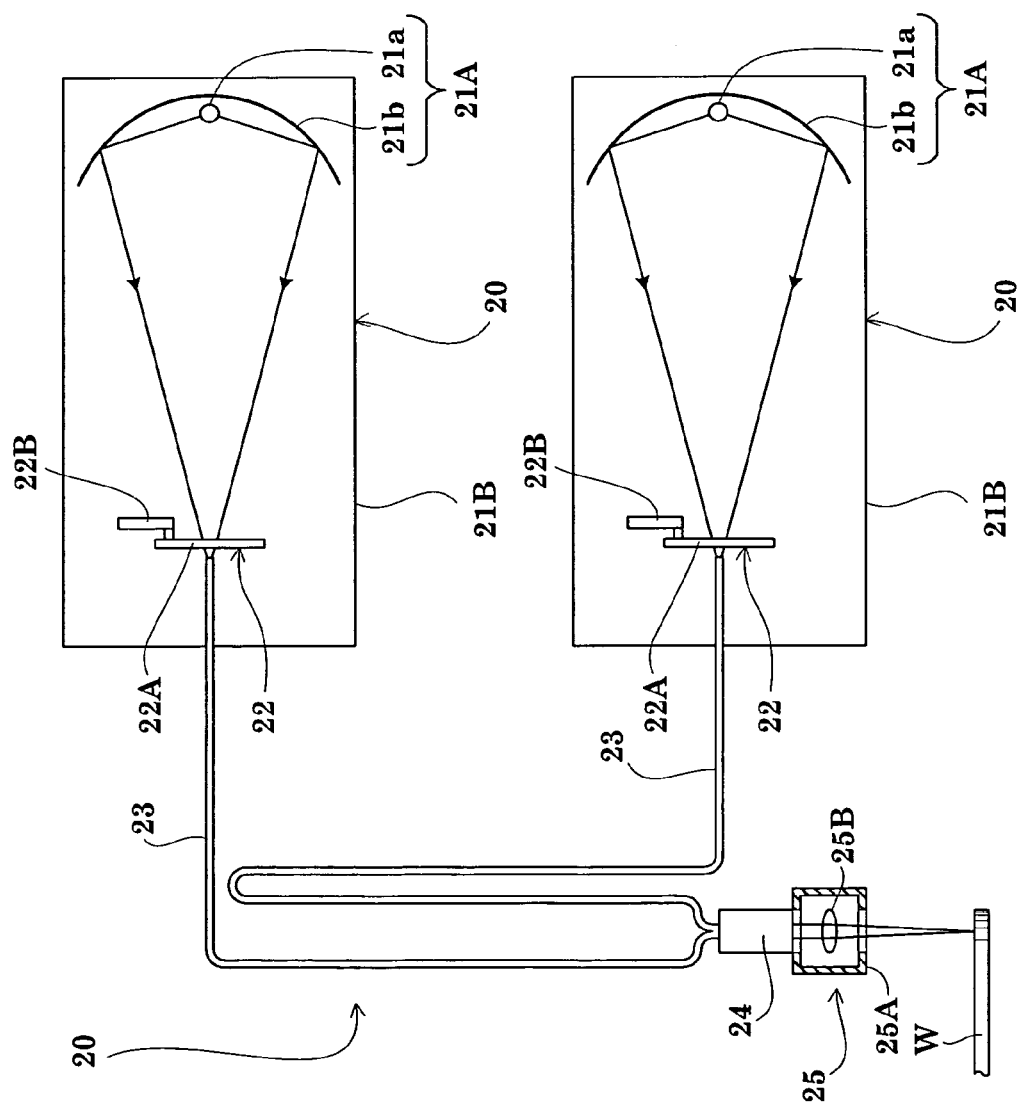

EDGE EXPOSING APPARATUS

BACKGROUND OF THE INVENTION (1) Field of the Invention

This invention relates to edge exposing apparatus for emitting light to and exposing edge regions of substrates such as semiconductor wafers, glass substrates for liquid crystal displays, glass substrates for photomasks, or substrates for optical disks (hereinafter called simply substrates).

(2) Description of the Related Art

In a conventional edge exposing apparatus, a light guide in the form of a bundle of optical fibers guides light emitted from a light source unit (light emitting unit) to irradiate and expose edge regions of each substrate. Such an apparatus has only one light source unit, and cannot perform an edge exposing operation in time of changing a lamp in the light source. Japanese Unexamined Patent Publication No. 2002-313708 discloses an apparatus for solving this problem to improve throughput of the edge exposing operation. The apparatus disclosed therein exposes substrate edges by mixing lights emitted from a plurality of light source units. This apparatus, while a lamp in one light source unit is changed, can continue an edge exposing operation using the remaining light source unit(s).

However, the conventional apparatus noted above has the following problems (I) and (II):

Problem (I)

It is difficult to assess a lowering of performance of a light source unit, which points to a necessity to change the lamp. In practice, the lamp is changed only after the performance of the light source unit lowers to the extent of causing trouble in edge exposure. Consequently, while the necessity is felt for a change, the other light source unit also may lower in performance so that the apparatus is unable to effect edge exposure. In addition, it takes time (e.g. about seven minutes) after the light source unit with a new lamp emits light (i.e. after startup of the light source unit) and before the light source unit is in a ready state for performing edge exposure (e.g. before stabilization of the light from the light source unit). When, after changing the lamp, edge exposure is performed using the new, changed light source unit, light may be emitted in an unstable state, resulting in a reduced quality of substrates.

Problem (II)

As described above, the light emitted from a light emitting unit is guided by a light guide in the form of a bundle of optical fibers to irradiate edge regions of a substrate. The light guided by the optical fibers has a non-uniform intensity distribution due to the fibers.

To eliminate this non-uniformity, the apparatus disclosed in Japanese Unexamined Patent Publication No. 2002-313708 noted above has a light guide divided into a first light guide and a second light guide, with a light mixing optical element interposed between the first light guide and second light guide. The light emitted from the light emitting unit is guided by the first light guide, and components of the light in the strands of the respective fibers forming the first light guide are mixed by the light mixing optical element. The mixed light is guided by the second light guide to exit to the edge regions of the substrate. This makes the non-uniform luminous intensity distribution into a uniform distribution. Where a plurality of light emitting units are provided, the light emitted from each light emitting unit is guided by the first light guide, and mixed by the light mixing optical element. The mixed light is guided by the second light guide to exit to the edge regions of the substrate to effect edge exposure.

However, the light guided by and exiting the second light guide has a rugged profile reflecting the configuration of the strands of the optical fibers (i.e. cross sections of the fibers) forming the second light guide. The profile of the light may be adjusted by arranging strip-shaped slits at a rugged boundary through which the light is emitted. Then, it is time-consuming and troublesome to put the strands of the fibers in order and arrange the slits.

SUMMARY OF THE INVENTION

This invention has been made having regard to the state of the art noted above, and its object is to provide an edge exposing apparatus capable of (I) avoiding a lowering in the quality of substrates by edge exposure while reducing delays in the edge exposure, and (II) performing uniform edge exposure without influences of a configuration of strands of optical fibers bundled to form a light guide device.

The above object (I) is fulfilled, according to this invention, by an edge exposing apparatus for performing edge exposure by emitting light to edge regions of substrates, comprising:

a first and a second light emitting units for emitting light;

a control device for controlling the light emitting units;

a performance decrease detecting device for detecting a decrease in performance of the light emitting units; and a ready state detecting device for detecting the light emitting units being in a ready state capable of performing edge exposure;

wherein, when edge exposure is effected with the light emitted from the first light emitting unit, the control device executes the following steps with respect to each of the light emitting units based on a detection made by the performance decrease detecting device of the first light emitting unit having lowered in performance:

(A) continuing the edge exposure with the first light emitting unit, and starting the second light emitting unit; and (B) terminating the edge exposure with the first light emitting unit, and performing edge exposure with the second light emitting unit, when the ready state detecting device detects the ready state of the second light emitting unit.

The edge exposing apparatus according to this invention includes the performance decrease detecting device for detecting a decrease in performance of the light emitting units. This is effective to avoid a situation where the light emitting units fall in performance to the extent of causing trouble in edge exposure. In the step (A) above, the edge exposure is continued with the first light emitting unit, and the second light emitting unit is started. In step (B), the edge exposure with the first light emitting unit is terminated, and edge exposure with the second light emitting unit is started. In this way, one of the light emitting units is used in performing edge exposure, thereby reducing the chance of delays occurring with the edge exposure.

The apparatus includes the ready state detecting device for detecting the light emitting units being in a ready state capable of edge exposure. As in step (B) above, when the ready state detecting device detects the ready state of the second light emitting unit, the edge exposure with the first light emitting unit is terminated, and edge exposure with the second light emitting unit is started. This avoids a lowering in the quality of substrates due to an edge exposing operation performed with a light emitting unit not in the ready state yet.

In another aspect of the invention, the object (I) noted hereinbefore is fulfilled by an edge exposing apparatus for performing edge exposure by emitting light to edge regions of substrates, comprising:

a plurality of light emitting units for emitting light;

a control device for controlling the light emitting units;

a performance decrease detecting device for detecting a decrease in performance of the light emitting units; and a ready state detecting device for detecting the light emitting units being in a ready state capable of performing edge exposure;

wherein, when edge exposure is effected with the light emitted from all of the light emitting units, the control device executes the following steps with respect to each of the light emitting units for changing one of the light emitting units based on a detection made by the performance decrease detecting device of the light emitting unit having lowered in performance:

(a) stopping the edge exposure with the light emitting unit to be changed, and continuing the edge exposure with a set of remaining light emitting units; and (b) starting a new, changed light emitting unit, adding the new, changed light emitting unit to the set of remaining light emitting units when the ready state detecting device detects the ready state of the new, changed light emitting unit, and performing edge exposure with the new, changed light emitting unit and the remaining light emitting units.

The above edge exposing apparatus according to this invention includes the performance decrease detecting device for detecting a decrease in performance of the light emitting units. This is effective to avoid a situation where the light emitting units fall in performance to the extent of causing trouble in edge exposure. Also where edge exposure is performed by light emission from all of the light emitting units, the performance decrease detecting device detects a decrease in performance before the light emitting units fall in performance to the extent of causing trouble in edge exposure. As in step (a) above, the edge exposure with the light emitting unit to be changed is stopped, thereby avoiding a situation where the remaining light emitting units also lower in performance so that edge exposure becomes impossible. This reduces the chance of delays occurring with the edge exposure.

The apparatus includes the ready state detecting device for detecting the light emitting units being in a ready state capable of edge exposure. As in step (b) above, the new, changed light emitting unit is started, the new, changed light emitting unit is added to the set of remaining light emitting units when the ready state detecting device detects the ready state of the new, changed light emitting unit, and edge exposure is performed with the new, changed light emitting unit and the remaining light emitting units. This avoids a lowering in the quality of substrates due to an edge exposure performed with a light emitting unit not in the ready state yet.

In the invention described above, when a light emitting unit having lowered in performance is included in a set of remaining light emitting units, or when a light emitting unit having lowered in performance cannot be identified, the steps (a) and (b) may be repeated a plurality of times to change successively a required number of the light emitting units to new light emitting units.

By repeating the steps (a) and (b) a plurality of times when a light emitting unit having lowered in performance is included in a set of remaining light emitting units, or when a light emitting unit having lowered in performance cannot be identified, a required number of the light emitting units are successively changed to new light emitting units. Thus, the light emitting units having lowered in performance are all changed to reduce delays in edge exposure, and to avoid a lowering in the quality of substrates due to an edge exposure performed with a light emitting unit not in the ready state yet.

In the apparatus devised to fulfilled the object (I) noted hereinbefore, examples of the performance decrease detecting device include the following.

An example of the performance decrease detecting device comprises a time measuring device for measuring a lighting time of the light emitting units for obtaining a quantity of light required for edge exposure, the decrease in performance of the light emitting units being detected when the lighting time measured reaches a predetermined value. That is, as the lighting time is extended, an integrated quantity of light has increased and the light emitting units are determined to have lowered in performance.

Another example of the performance decrease detecting device comprises a substrate counting device for counting the substrates having undergone the edge exposure, the decrease in performance of the light emitting units being detected when a count of the substrates reaches a predetermined value. With an increase in the number of substrates undergoing edge exposure, an integrated quantity of light increases and the light emitting units are determined to have lowered in performance.

A further example of the performance decrease detecting device comprises a luminous intensity detecting device for detecting luminous intensity of the light emitting units, the decrease in performance of the light emitting units being detected when the luminous intensity detected is less than a predetermined value. Thus, when luminous intensity has lowered, the light emitting units are determined to have lowered in performance.

A decrease in performance may be detected by using both the time measuring device and the luminous intensity detecting device. That is, the performance decrease detecting device comprises a time measuring device for measuring a lighting time of the light emitting units for obtaining a quantity of light required for edge exposure, and luminous intensity detecting device for detecting luminous intensity of the light emitting units, the decrease in performance of the light emitting units being detected when the lighting time measured reaches a predetermined value, and the luminous intensity detected is less than a predetermined value.

In the apparatus devised to fulfilled the object (I) noted hereinbefore, examples of the ready state detecting device include the following.

An example of the ready state detecting device comprises a time measuring device for measuring an elapsed time from a startup of the light emitting units, the ready state of the light emitting units being detected when the elapsed time measured reaches a predetermined value. That is, with a passage of time from a startup, the light emitting units are determined to be in the ready state capable of performing edge exposure.

Another example of the ready state detecting device comprises a luminous intensity detecting device for detecting luminous intensity of the light emitting units, the ready state of the light emitting units being detected when the luminous intensity detected reaches a predetermined value. When the luminous intensity increases to a level capable of edge exposure, the light emitting units are determined to be in the ready state for performing edge exposure.

Where the ready state detecting device comprises the luminous intensity detecting device noted above, the luminous intensity detecting device may be disposed in each of the light emitting units.

In a further aspect of the invention, the object (II) noted hereinbefore is fulfilled by an edge exposing apparatus for performing edge exposure by emitting light to edge regions of substrates, comprising:

a plurality of light emitting units for emitting light;

a plurality of light guide devices optically connected in a one-to-one relationship to ends of the light emitting units; and a light mixing optical element optically connected to other ends of the light guide device;

wherein the light mixing optical element is arranged to irradiate the edge regions of each substrate directly with light mixed by the light mixing optical element.

With the above edge exposing apparatus according to this invention, the lights emitted from the light emitting units are guided through the light guide device, and mixed by the light mixing optical element. Thus, the mixed light may irradiate the edge regions of each substrate without being influenced by the shapes of the optical fiber strands bundled to form the light guide device. Since the mixed light directly irradiates the edge regions of each substrate, the edge regions may be exposed uniformly and free from the influence of the shapes of the optical fiber strands bundled to form a light guide at the exit end toward the substrate as in the prior art In the above apparatus according to the invention, the light mixing optical element may include a lens disposed adjacent an end thereof opposed to each substrate for converging bundles of rays, the lens being arranged to converge each bundle of rays transmitted therethrough adjacent the edge regions of each substrate.

With the lens for converging a bundle of rays is disposed at the end of the light mixing optical element directed to the substrate, each bundle of rays transmitted through the lens is converged adjacent the edge regions of each substrate. Thus, edge exposure may be performed with increased precision.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 2A is a view showing an outline of a treating mechanism;

FIG. 2B is an enlarged view of a quartz rod and adjacent components shown in FIG. 2A;

DESCRIPTION OF THE PREFERRED EMBODIMENTS

Preferred embodiments of this invention will be described in detail hereinafter with reference to the drawings.

First Embodiment

Figure 1:
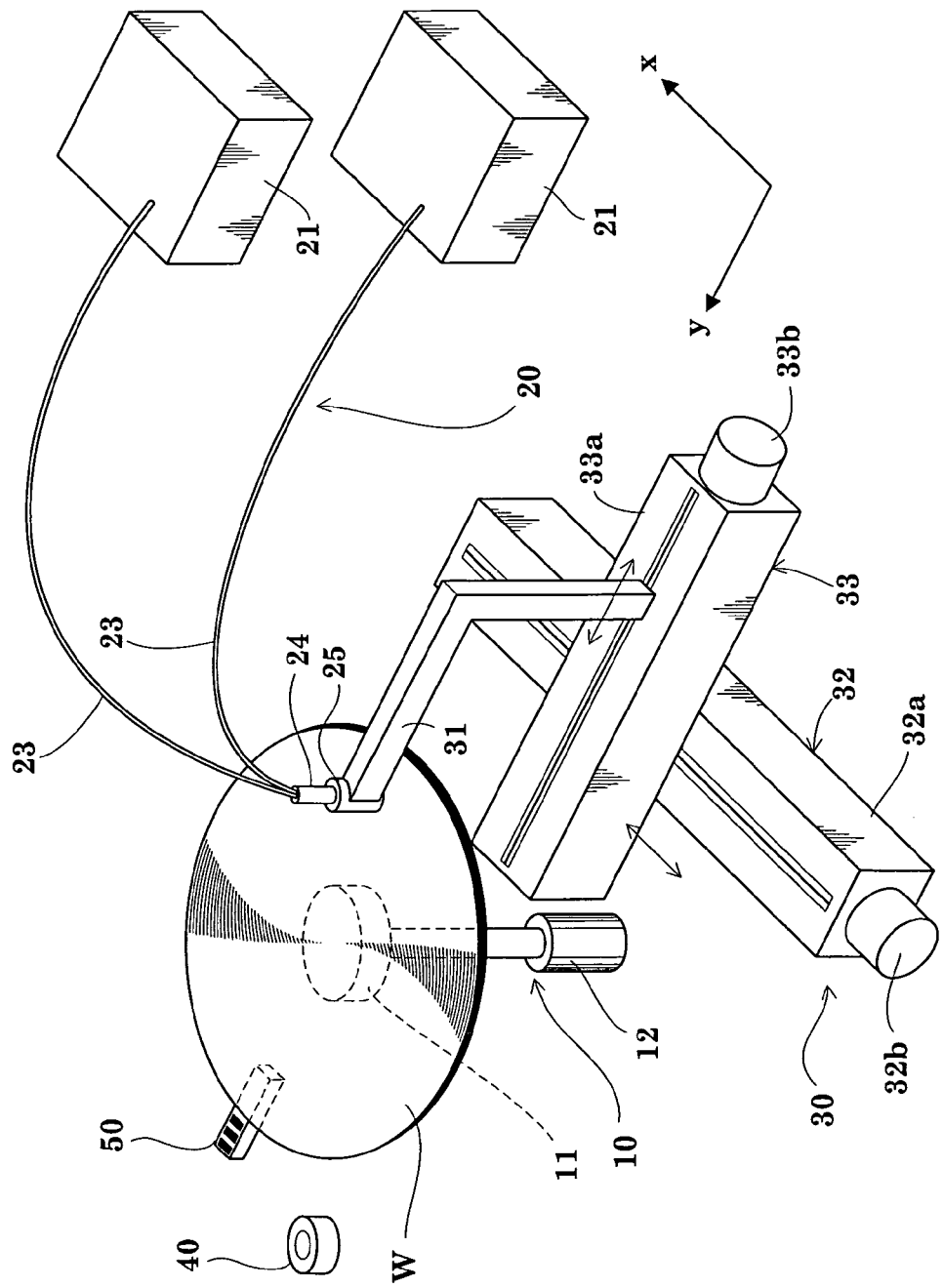
FIG. 1 is a perspective view showing an outline of an edge exposing apparatus in a first to a third embodiments of the invention.
Figure 3:
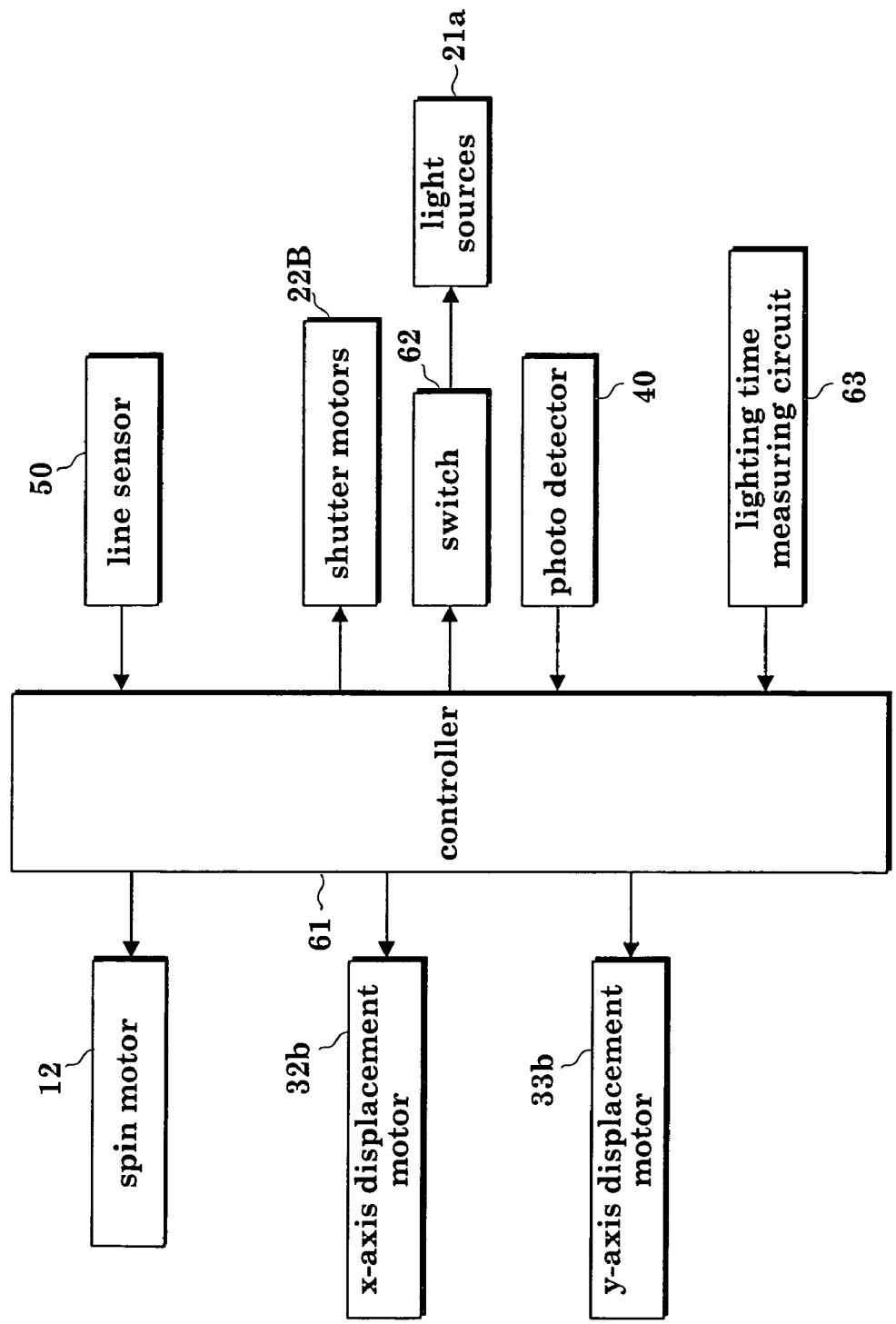
FIG. 3 is a block diagram of a control system.

FIG. 1 is a perspective view showing an outline of an edge exposing apparatus in a first to a third embodiments of the invention. FIG. 2A is a view showing an outline of a treating mechanism. FIG. 2B is an enlarged view of a quartz rod and adjacent components shown in FIG. 2A. FIG. 3 is a block diagram of a control system.

As shown in FIG. 1, the apparatus in the first embodiment includes a substrate spinning mechanism 10 having a spin chuck 11, a treating mechanism 20 having light source units 21, light guides 23 and an irradiation head 25, and a moving mechanism 30 for moving the irradiation head 25 in a horizontal plane (xy plane).

The substrate spinning mechanism 10 includes the spin chuck 11 and a spin motor 12. The spin chuck 11 supports a wafer W in horizontal posture by suction. The spin chuck 11 is connected to the spin motor 12 to be rotatable about a vertical axis to spin the wafer W as suction-supported about the vertical axis, i.e. in a horizontal plane.

As shown in FIGS. 2A and 2B, the treating mechanism 20 includes a plurality of light source units 21, the same number of shutters 22, the same number of light guides 23, one quartz rod 24 and one irradiation head 25.

The first embodiment will be described as having two light source units 21. Each light source unit 21 has, for example, a mercury xenon lamp 21A for outputting light (e.g. ultraviolet light) in a waveband for exposing photoresist film formed on the wafer W, and a box-like lamp house 21B accommodating the lamp 21A and other components. The ultraviolet light is led to the irradiation head 25 through the light guide 23 and a light mixing optical element 24A (FIG. 2B) described hereinafter. The mercury xenon lamp 21A includes a light source 21a and an elliptic mirror 21b. The light source units 21 correspond to the light emitting units in this invention. An ultraviolet transmission filter may be provided in the lamp house 21B.

The shutter 22 is disposed at the side of the light source unit 21 where the light exits toward the wafer W. The shutter 22 includes a shielding plate 22A for shielding the irradiating light, and a shutter motor 22B. The shielding plate 22A is connected to the shutter motor 22B to be vertically movable, so that the light source unit 21 is opened and closed by the shutter 22.

As shown in FIG. 2B, each light guide 23 is formed of a bundle of a plurality of optical fiber strands 23a. The light guides 23 (two light guides 23 in the first embodiment) are in a one-to-one relationship with the light source units 21. One end of each light guide 23 is optically connected to one of the light source units 21, while the other end of each light guide 23 is optically connected to the light mixing optical element 24A of the quartz rod 24 (FIG. 2B). The light guides 23 correspond to the light guide device in this invention.

The quartz rod 24 includes the light mixing optical element 24A, and a guide holder 24B fixedly holding the optical element 24A at opposite surfaces thereof. The guide holder 24B fixedly holds the two light guides 23 at opposite surfaces thereof, so that each light guide 23 is connected at the other end thereof to the light mixing optical element 24A.

The irradiation head 25 includes a box-like head unit 25A and a projecting lens 25B mounted therein. The quartz rod 24 has an exit surface 24a thereof opposed and fixed to the irradiation head 25. The light mixed by the light mixing optical element 24A is transmitted through the projecting lens 25B in the head unit 25A to converge the respective bundles of rays adjacent edge regions of the wafer W. The projecting lens 25B corresponds to the lens in this invention.

As shown in FIG. 1, the moving mechanism 30 includes a support arm 31, an x-axis displacing mechanism 32 and a y-axis displacing mechanism 33. The x-axis displacing mechanism 32 includes a housing member 32a, an x-axis displacement motor 32b, and a screw shaft not shown. The y-axis displacing mechanism 33 includes a housing member 33a, a y-axis displacement motor 33b, and a screw shaft not shown.

The x-axis displacement motor 32b rotates the associated screw shaft, whereby the housing member 33a of the y-axis displacing mechanism 33 moves in an x-direction, and the entire y-axis displacing mechanism 33 also moves in the x-direction. Similarly, the y-axis displacement motor 33b rotates its screw shaft, whereby the support arm 31 moves in a y-direction.

The irradiation head 25 described above is attached to a forward end of the support arm 31. Thus, the irradiation head 25 is movable in both x- and y-directions by the motors 32b and 33b of the x- and y-axis displacing mechanisms 32 and 33. That is, the irradiation head 25 makes parallel translations in a horizontal plane. The moving mechanism 30 may include also a mechanism for causing vertical movements.

The apparatus in the first embodiment further includes a photo detector 40 and a line sensor 50. The photo detector 40 has a photo detecting device formed of a light window and a CCD not shown. The photo detector 40 detects an intensity of light with the photo detecting device converting the bundle of rays incident through the light window into electric signals. On the other hand, the line sensor 50 has a plurality of CCDs in juxtaposition, and is disposed in a position corresponding to a track of rotation of the edge regions of wafer W. Since the photo detector 40 is a device for detecting luminous intensity, it corresponds to the luminous intensity detecting device in this invention. When the luminous intensity detected is below a preset value, the light source units 21 are determined low in performance. When the luminous intensity detected reaches or exceeds the preset value, the light source units 21 are determined in a ready state capable of edge exposure. Thus, the photo detector 40 corresponds also to the performance decrease detecting device and the ready state detecting device in this invention.

Next, the construction of the control system of the apparatus in the first embodiment will be described. A controller 61 has a function of a computing device such as a CPU (central processing unit). As shown in FIG. 3, the controller 61 has, connected thereto, besides the above-noted spin motor 12, shutter motors 22B, x-axis displacement motor 32b, y-axis displacement motor 33b, photo detector 40 and line sensor 50, a switch 62 for turning the light sources 21a on and off, and a lighting time measuring circuit 63 for measuring an irradiation time for obtaining a quantity of light required for edge exposure and an elapsed time from a start of the light source units 21, that is a lighting time of the lamps 21A. The controller 61 corresponds to the control device in this invention.

The lighting time measuring circuit 63 has the function of a timer or clock, and a timer count is started as soon as the switch 62 turns on the light sources 21a to light the light source units 21 (to emit ultraviolet light). A lighting time (irradiation time or elapsed time) from a start of lighting (startup) is measured by the timer count. Thus, the lighting time measuring circuit 63 is a device for measuring a lighting time, and corresponds to the time measuring device in this invention. When the irradiation time measured reaches a preset value, the light emitting units are determined low in performance. When the elapsed time measured reaches a preset value, the light emitting units are determined ready for edge exposure. Thus, the lighting time measuring circuit 63 corresponds also to the performance decrease detecting device and the ready state detecting device in this invention.

Figure 4:
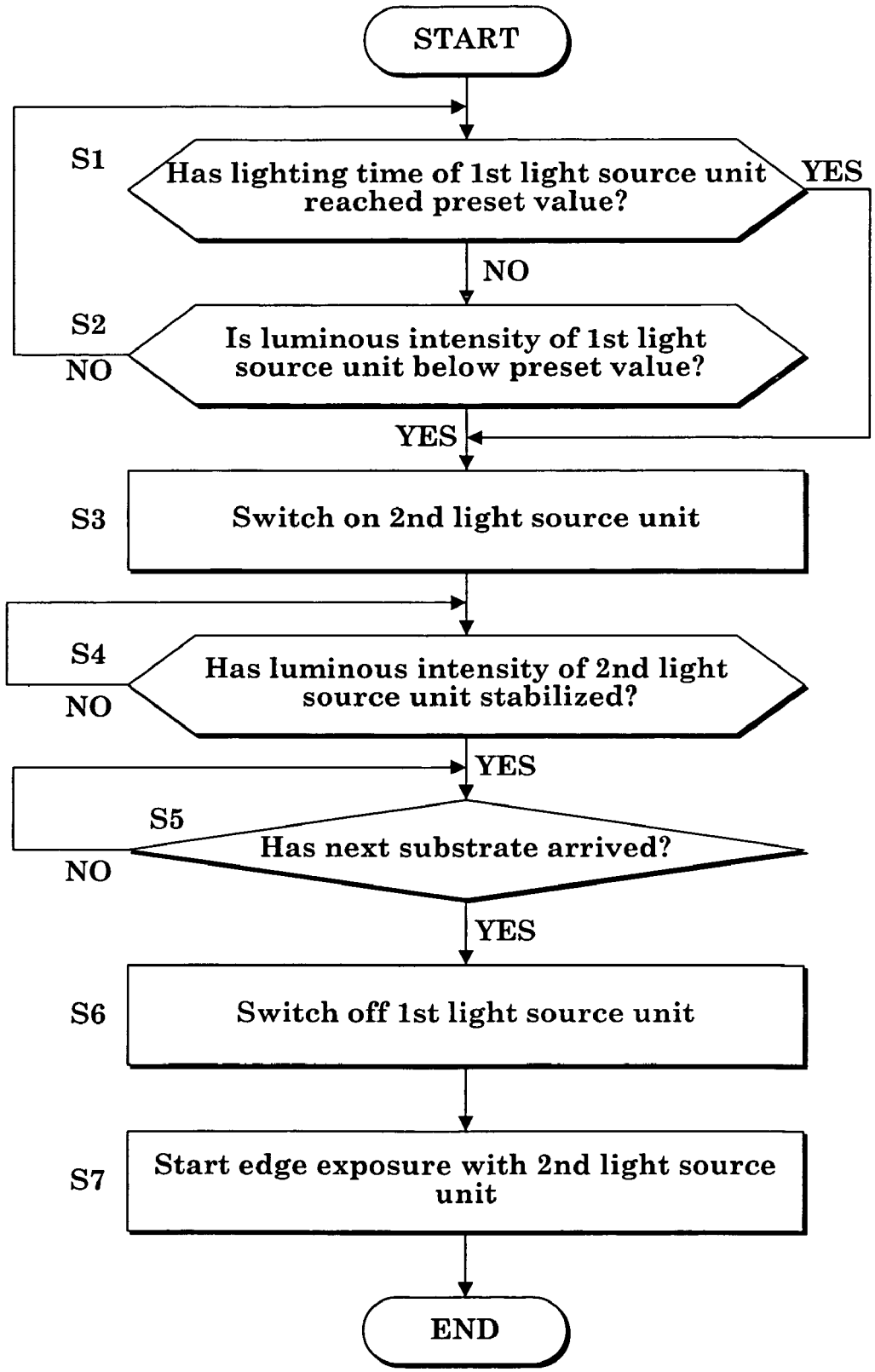
FIG. 4 is a flow chart of an edge exposing operation in the first embodiment.
Figure 5:
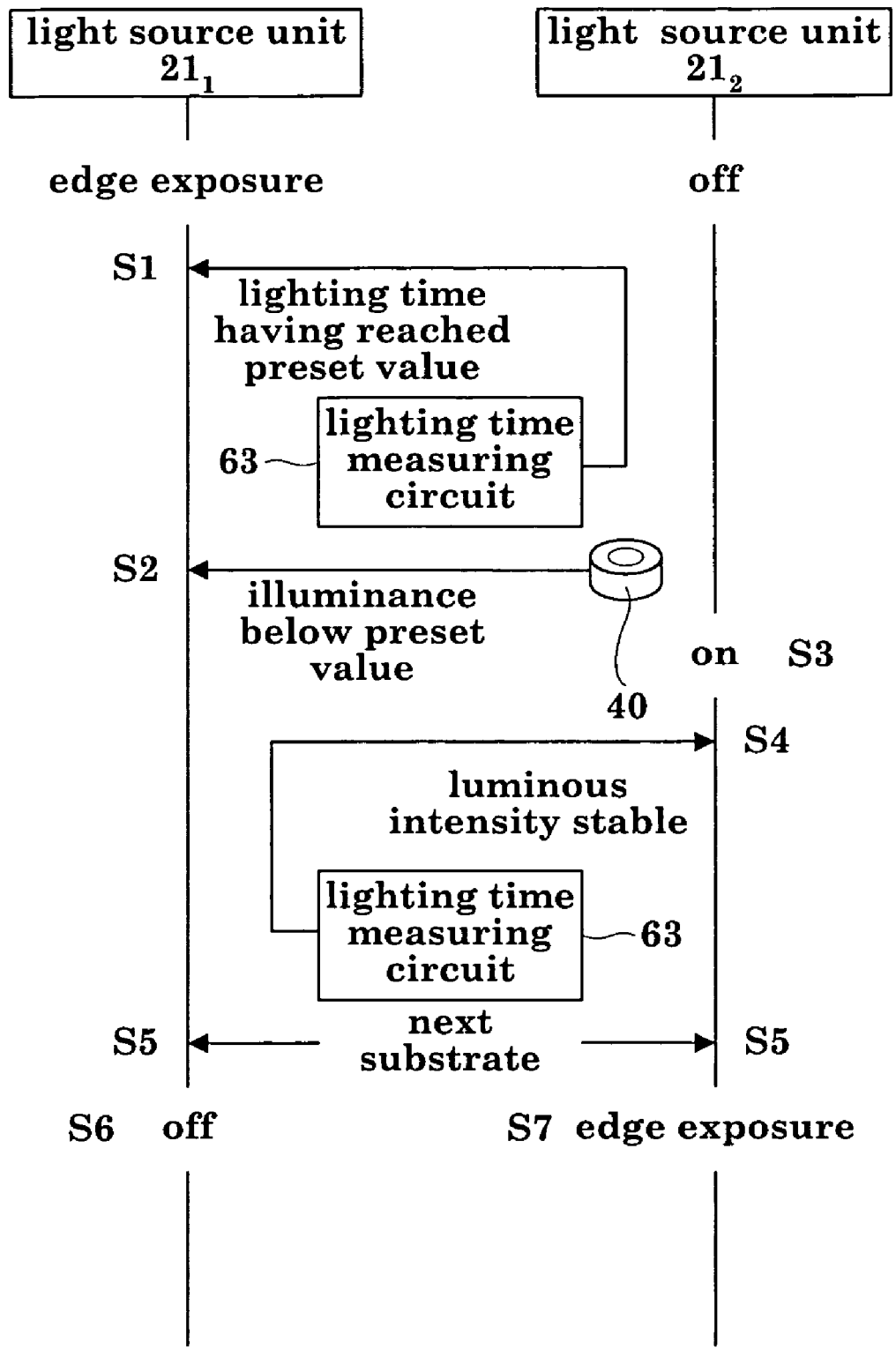
FIG. 5 is a timing chart of the edge exposing operation in the first embodiment.

Next, a procedure in a series of edge exposing steps will be described with reference to the flow chart shown in FIG. 4 and the timing chart shown in FIG. 5. In the first embodiment, an edge exposing process is carried out with only one of the light source units 21. For expediency of description, one of the two light source units 21 will be referred to as "light source unit $21_1$", and the other as "light source unit $21_2$". The light source unit $21_1$ corresponds to the first light emitting unit in this invention, and the light source unit $21_2$ to the second light emitting unit in this invention.

(Step S1) has the Lighting Time of the First Light Source Unit Reached the Preset Value?

While an edge exposing operation with the light source unit $21_1$ (the first light source unit in FIG. 4) is in progress, the lighting time measuring circuit 63 measures a lighting time (irradiation time or elapsed time) from a start of lighting (startup). The lighting time measuring circuit 63 also monitors whether the lighting time has reached the preset value. Specifically, the lighting time measuring circuit 63 monitors whether the lamp 21A of the light source unit $21_1$ has reached a breakdown life (e.g. 3,000 hours). The same is the case with step T1 in the second embodiment, step U1 in the third embodiment and step V1 in the fourth embodiment described hereinafter. When the lighting time is below the preset value, the operation moves to the following step S2. When the lighting time has reached the preset value, it is determined that, as the lighting time is extended, an integrated quantity of light has increased and the light source unit $21_1$ has lowered in performance. The operation then jumps to step S3. The preset value of lighting time (3,000 hours noted above) at which the performance of the light source unit $21_1$ falls may be obtained by rule of thumb, and may be determined by obtaining sample data of lighting time in advance of the edge exposure.

(Step S2) is the Luminous Intensity of the First Light Source Unit Below a Preset Value?

After the lighting time is found in step S1 to have reached the preset value, the photo detector 40 detects the intensity of light emitted from the light source unit $21_1$ (first light source unit). The photo detector 40 determines whether the luminous intensity is below a preset value. When the luminous intensity is below the preset value, it is determined that the luminous intensity has fallen and the light source unit $21_1$ has become low in performance. The operation then moves to the following step S3. When the luminous intensity equals or exceeds the preset value, the operation returns to step S1. The preset value of luminous intensity at which the performance of the light source unit $21_1$ falls may also be obtained by rule of thumb.

(Step S3) Switch on the Second Light Source Unit.

When the lighting time is found in step S1 to have reached the preset value, or when the luminous intensity is found in step S2 to be below the preset value, that is when the light source unit $21_1$ is determined low in performance, the other light source unit $21_2$ (the second light source unit in FIG. 4) is started to switch on the lamp 21A of the light source unit $21_2$. Specifically, the controller 61 controls the switch 62 to turn on the light source 21a of the light source unit $21_2$. At this time, the edge exposure with the light source unit $21_1$ (first light source unit) is continued. The light source unit $21_2$ is not used in edge exposure from step S3 until step S7, described hereinafter, for starting edge exposure with the second light source unit. The shutter 22 is closed so that the light emitted from the light source unit $21_2$ is prevented from exiting the lamp house 21B to irradiate the wafer W. Specifically, when the shutter 22 is not closed, the controller 61 controls the shutter motor 22B to lower the shielding plate 22A to close the shutter 22. When the shutter 22 is already closed, the controller 61 does not operate the shutter motor 22B.

(Step S4) has the Luminous Intensity of the Second Light Source Unit Stabilized?

The lighting time measuring circuit 63 measures the lighting time (elapsed time) from the startup of the light source unit $21_2$ (second light source unit). The lighting time measuring circuit 63 also monitors whether the lighting time has reached a preset value. The same is the case with steps T8 and T14 in the second embodiment, steps U8 and U14 in the third embodiment and steps V8 and V14 in the fourth embodiment described hereinafter. When the lighting time is below the preset value, the operation stands by in step S4 until the lighting time reaches the preset value. When the lighting time has reached the preset value, the light source unit $21_2$ is determined to have become ready for edge exposure (that is, its luminous intensity has stabilized) with a passage of time from the startup. Then, the operation moves to step S5. The preset value of lighting time for attaining the ready state may also be obtained by rule of thumb (e.g. seven minutes from the switch-on). The light source units 21 having become ready will fall in performance next. Therefore, the preset value (seven minutes) of lighting time for the determination made in step S4 as to the ready state is shorter in time than the preset value (3,000 hours) of lighting time for determination made step S2 as to the performance of the light source unit $21_1$.

(Step S5) has a Next Substrate Arrived?

When the lighting time is found in step S4 to have reached the preset value, that is when the light source unit $21_2$ is determined to be in the ready state, the edge exposure with the light source unit $21_1$ is continued until a next wafer W is received. That is, when the next wafer W has not arrived, the edge exposure is continued while the operation stands by in step S5 until arrival of the next wafer W. When the next wafer W arrives, the operation moves to step S6 noting that the wafer W has been received.

(Step S6) Switch Off the First Light Source Unit.

The emission of light from the light source unit $21_1$ (first light source unit) is stopped, that is the lamp 21A of the light source unit $21_1$ is switched off. Specifically, the controller 61 controls the switch 62 to turn off the light source 21a of the light source unit $21_1$. This switching operation terminates the edge exposure with the light source unit $21_1$. In the first embodiment, the edge exposure is terminated by stopping the light emission (switch-off). The edge exposure may be terminated by closing the shutter 22, instead. The closing of the shutter 22 and the switch-off may be carried out simultaneously.

(Step S7) Start Edge Exposure with the Second Light Source Unit.

Substantially simultaneously with step S6, edge exposure of the next wafer W with the light source unit $21_2$ (second light source unit) is started. Specifically, the edge exposure is started by opening the shutter 22. The controller 61 controls the shutter motor 22B to raise the shielding plate 22A of the shutter 22 to an open position. Immediately before the start of edge exposure, the photo detector 40 is operated to detect the intensity of light emitted from the light source unit $21_2$ in order to measure an irradiation time.

The light source unit $21_1$ withdrawn from the edge exposure in step S6 may have its lamp 21A changed in preparation for a next edge exposing operation.

As described above, the first embodiment provides the photo detector 40 and lighting time measuring circuit 63 for detecting a decrease in performance of the light source units 21. This is effective to avoid a situation where the light source units 21 fall in performance to the extent of causing trouble in edge exposure. In steps S1 to S5, the edge exposure with the first light source unit is continued. In step S3, the second light source unit is started to emit light. In step S6, the edge exposure with the first light source unit is terminated. In step S7, the edge exposure with the second light source unit is started. In this way, one of the light source units 21 is used in performing edge exposure, thereby reducing the chance of delays occurring with the edge exposure.

The invention provides the ready state detecting device for detecting the light source units 21 being in a ready state capable of edge exposure. In the first embodiment, the lighting time measuring circuit 63 serves also as the ready state detecting device. When, as in step S4, the lighting time measuring circuit 63 detects the ready state of the second light source unit, step S6 is executed to end the edge exposure with the first light source unit, and step S7 is executed to start edge exposure with the second light source unit. This avoids a lowering in the quality of wafer W due to an edge exposing operation performed with a light source unit not in the ready state yet.

In the first embodiment, the photo detector 40 and lighting time measuring circuit 63 are used for detecting a decrease in performance of the light source units 21. That is, the light source units 21 are determined low in performance when the lighting time (irradiation time) is found in step S1 to have reached the preset value, or when the luminous intensity is found in step S2 to be below the preset value.

In the first embodiment, the lighting time measuring circuit 63 is used for detecting the ready state of the light source units 21. That is, the ready state of the light source units 21 is detected when the lighting time (elapsed time) is found in step S4 to have reached the preset value.

As is clear also from the flow chart and timing chart described above, there is a time lag between the start of lighting of the second light source unit in step S3 and the start of edge exposure with the second light source unit in step S7. The edge exposure with the second light source unit is started after the second light source unit attains the ready state following the start of lighting. Thus, as in the first embodiment, the time lag between the start of lighting and the start of edge exposure may be controlled in a simple way by providing the shutter 22 at the side of each light source unit 21 where the light exits toward the wafer W, and opening the light source unit 21 with the shutter 22 to start edge exposure. A transition from the start of light emission from the second light source unit to the start of edge exposure may be effected easily by operating the shutter 22 to open the light source unit 21.

The time lag between the start of lighting of the second light source unit and the start of edge exposure with the second light source unit may be controlled by other means than opening and closing of the shutter 22. That is to provide the irradiation head 25 for each light source unit 21, retract the irradiation head 25 from the substrate undergoing edge exposure while the light source unit 21 is lit but not ready yet, and move the irradiation head 25 over an edge region of the substrate upon start of edge exposure. The first embodiment, with the light mixing optical element 24A mixing the light, provides one irradiation head 25 regardless of the number of the light source units 21. It is thus desirable to start edge exposure by opening each light source unit 21 with the shutter 22.

Conversely, there is not necessarily a time lag between a termination of edge exposure and a switching off of light (stopping of light emission) from each light source unit 21. For stopping the light emission from the light source unit 21 after the termination of edge exposure, the shutter 22 is provided as in the first embodiment and edge exposure is terminated by closing the light source unit 21 with the shutter 22. After the closure, the light emission from the light source unit 21 may be stopped. For terminating edge exposure and stopping the light emission from the light source unit 21 at the same time, edge exposure is terminated by stopping the light emission from the light source unit 21 as in the first embodiment. In this case, the shutter 22 as in the first embodiment is dispensable. This modification is applicable also to the second to fourth embodiments described hereinafter.

Further, the first embodiment provides the plurality of (two) light source units 21, the plurality of (two) light guides 23 optically connected at ends thereof to the light source units 21 in a one-to-one relationship, and the light mixing optical element 24A optically connected to the other ends of the light guides 23. The light mixed by the light mixing optical element 24A directly irradiates the edge regions of wafer W. Where, as in the second to fourth embodiments described hereinafter, each light emitted from each light source unit 21 is mixed for use in edge exposure of wafer W, the light emitted from each light source unit 21 is mixed by the light mixing optical element 24A through the light guide 23. Since each light guided through the light guide 23 is mixed by the light mixing optical element 24A, the mixed light may irradiate the edge regions of wafer W without being influenced by the shapes of the optical fiber strands 23a bundled to form the light guide 23. Since the mixed light directly irradiates the edge regions of wafer W, the edge regions may be exposed uniformly and free from the influence of the shapes of the optical fiber strands bundled to form a light guide at the exit end toward the substrate as in the prior art (which is the second light guide in Japanese Unexamined Patent Publication No. 2002-313708 noted hereinbefore).

Further, the projecting lens 25B for converging a bundle of rays is disposed at the end of the light mixing optical element 24A directed to the wafer W. Since each bundle of rays transmitted through the projecting lens 25B is converged adjacent the edge regions of wafer W, edge exposure may be performed with increased precision.

While the first embodiment uses two light source units 21, the same results are obtained from use of three or more light source units 21. For example, four light source units 21 may be divided, two each, into first and second light source units. While continuing edge exposure with the two first light source units, the two second light source units may be started. When these second light source units are detected to be in the ready state, the edge exposure with the first light source units may be ended to give way to edge exposure with the second light source units. The first light source unit(s) and second light source unit(s) need not be the same in number. For example, three light source units 21 may be divided into two first light source units and one second light source unit.

Second Embodiment

The second embodiment of this invention will be described next with reference to the drawings.

Figure 6:
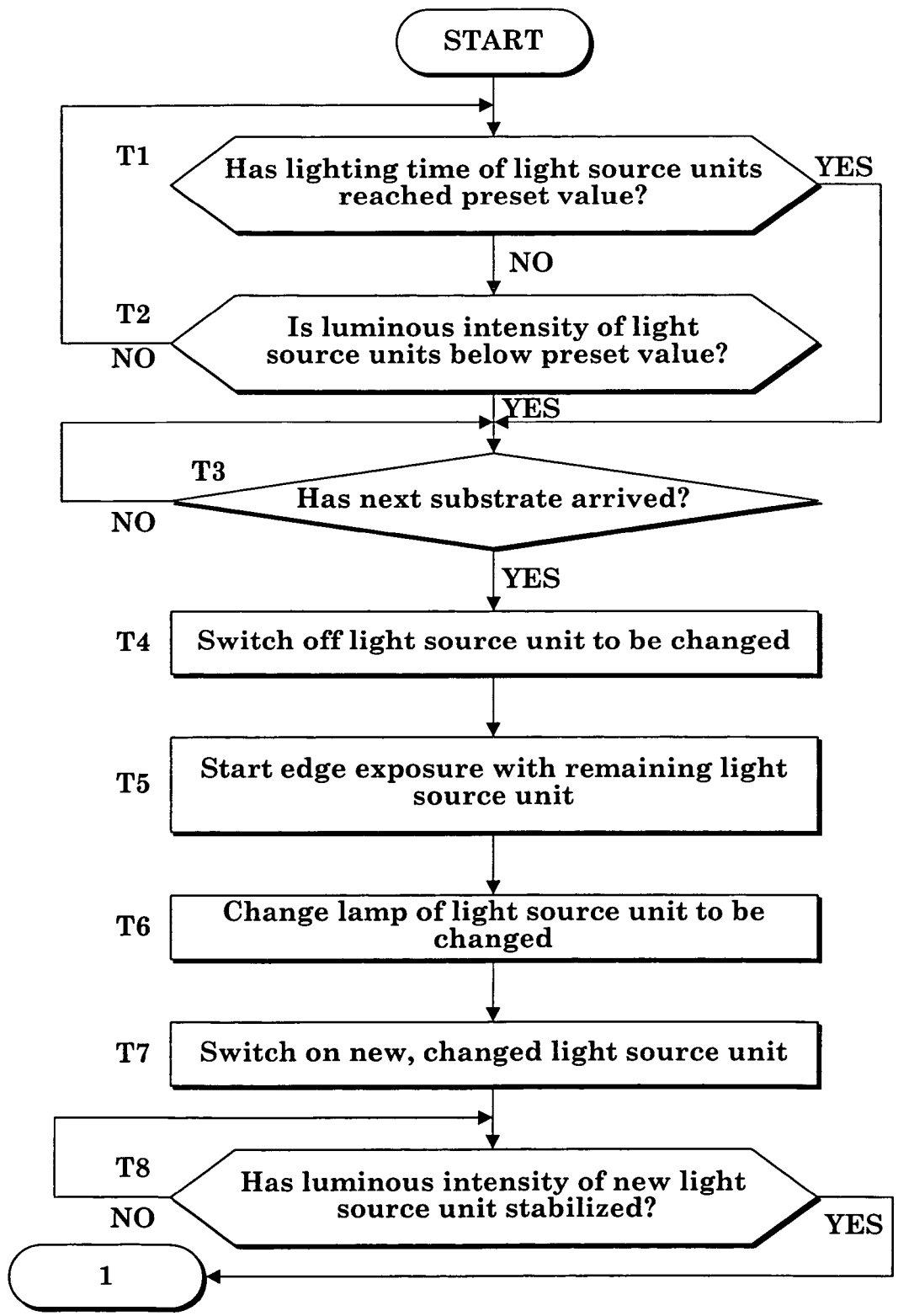
FIG. 6 is a flow chart of an edge exposing operation in the second embodiment.
Figure 7:
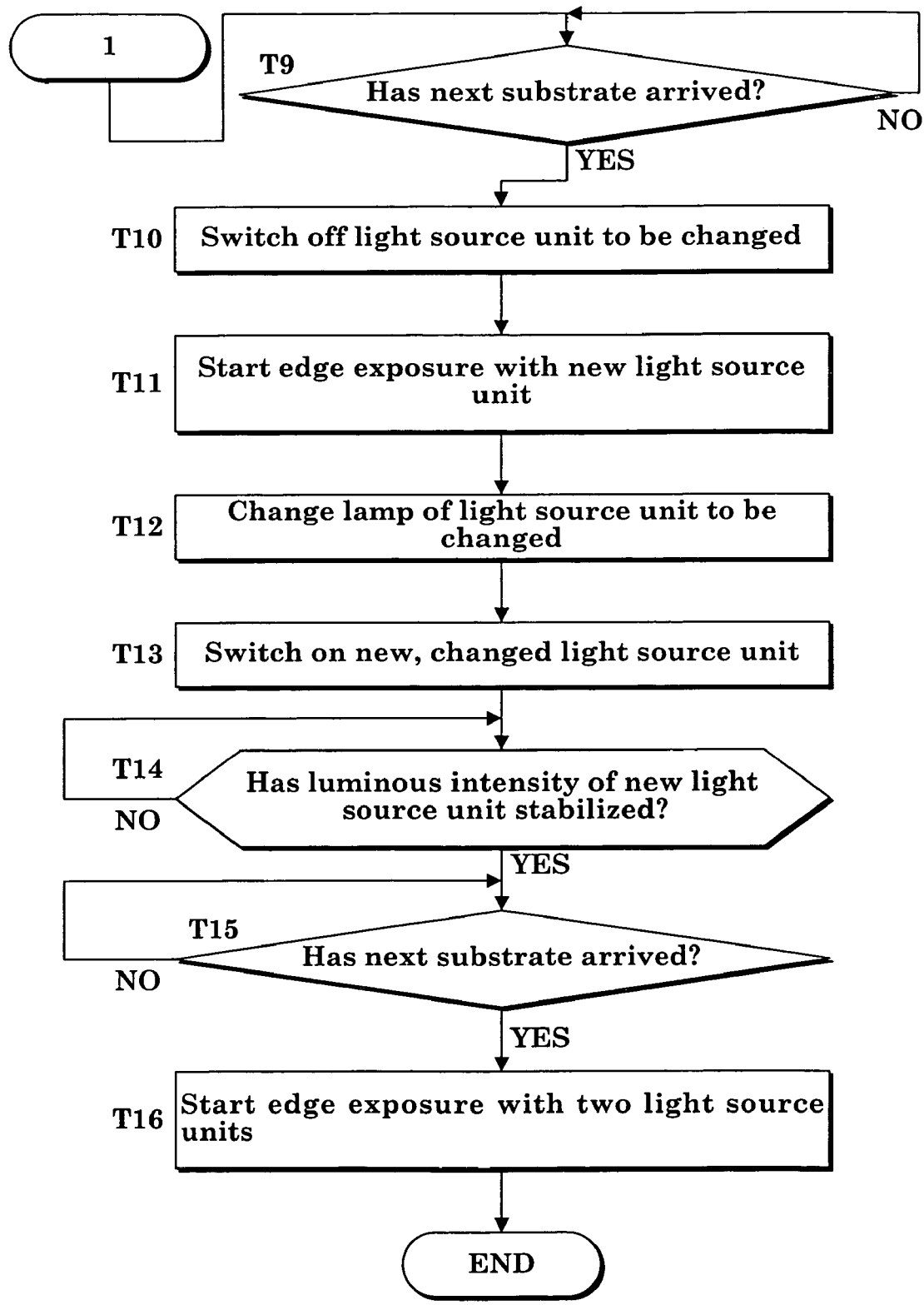
FIG. 7 is a flow chart of the edge exposing operation in the second embodiment.
Figure 8:
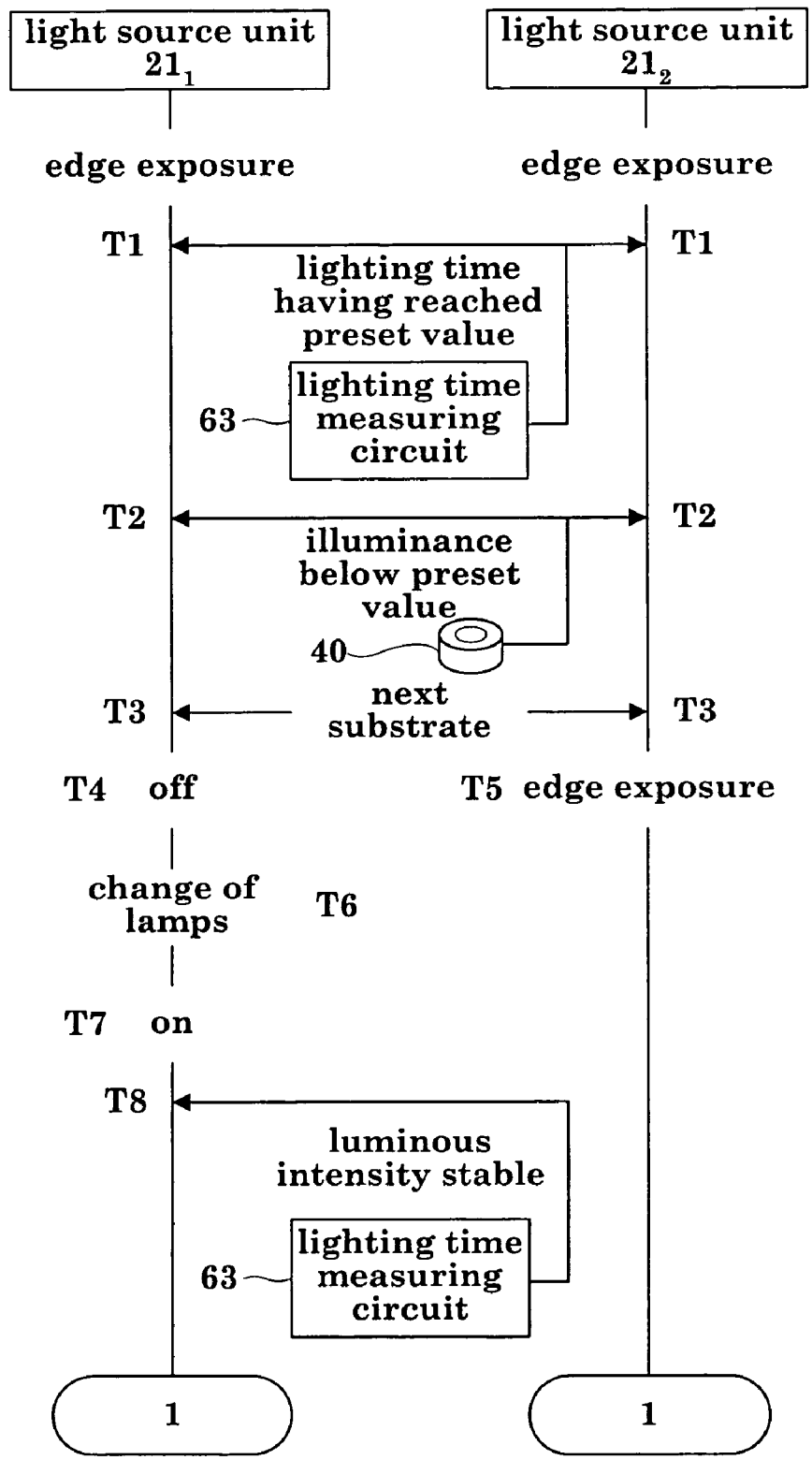
FIG. 8 is a timing chart of the edge exposing operation in the second embodiment.
Figure 9:
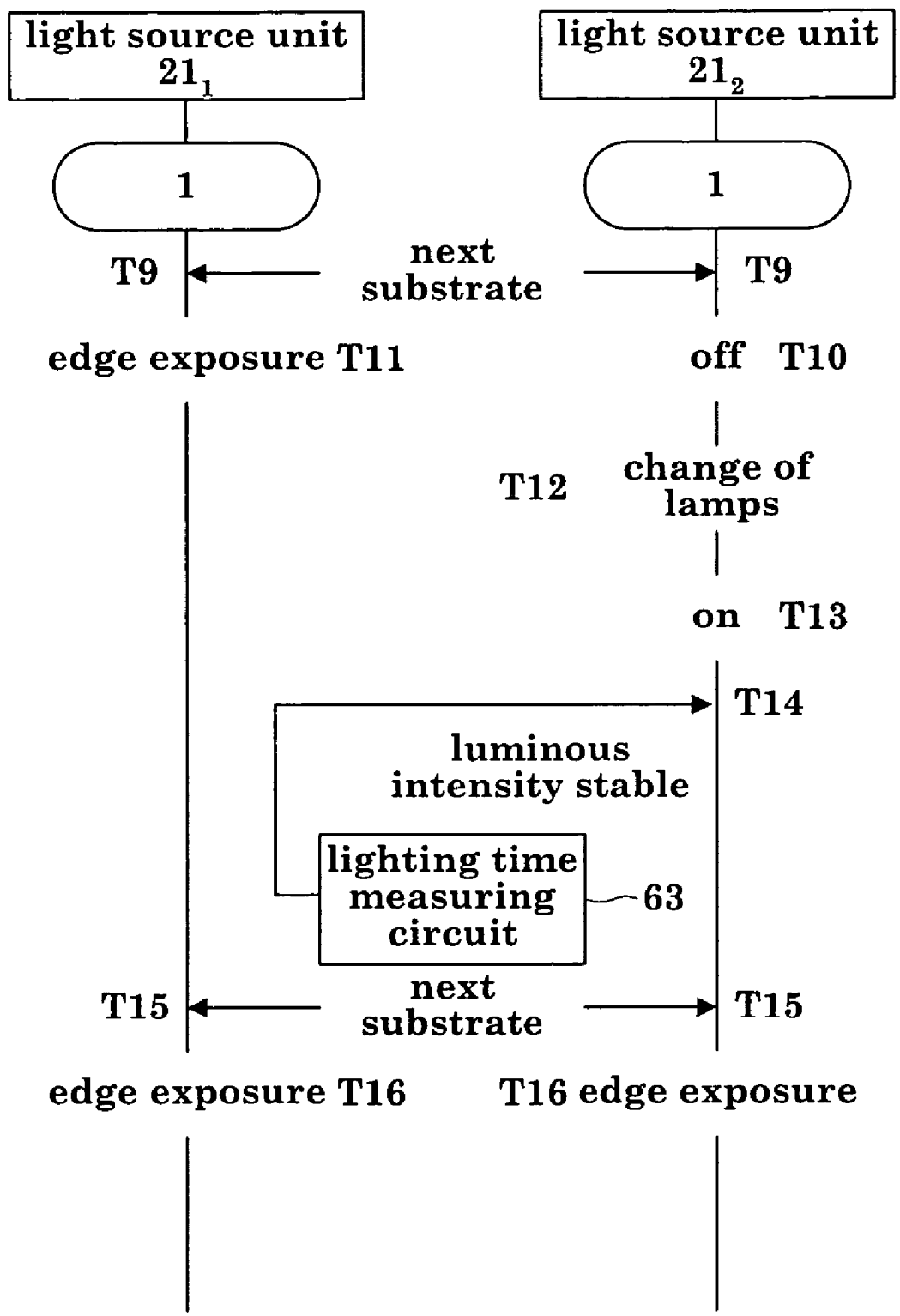
FIG. 9 is a timing chart of the edge exposing operation in the second embodiment.

FIGS. 6 and 7 are flow charts of an edge exposing operation in the second embodiment. FIGS. 8 and 9 are timing charts of the edge exposing operation in the second embodiment. The apparatus in the second embodiment has the same construction as in the first embodiment, and will not be described again.

In the second embodiment, an edge exposing process from start of edge exposure to switch-off is carried out with the two light source units 21. As in the first embodiment, one of the two light source units 21 will be referred to as "light source unit $21_1$", and the other as "light source unit $21_2$". In the second embodiment, and in the third embodiment described hereinafter, the lights emitted from the light source units $21_1$ and $21_2$ are mixed by the light mixing optical element 24A. The mixed light is used to irradiate the edge regions of wafer W to perform edge exposure. In the second embodiment, the lamps of the light source units $21_1$ and $21_2$ are changed with new ones in order.

(Step T1) has the Lighting Time of the Light Source Units Reached a Preset Value?

While an edge exposing operation with the two light source units $21_1$ and $21_2$ is in progress, the lighting time measuring circuit 63 measures a lighting time. The lighting time measuring circuit 63 also monitors whether the lighting time has reached a preset value. When the lighting time is below the preset value, the operation moves to the following step T2. When the lighting time has reached the preset value, it is determined that, as the lighting time is extended, an integrated quantity of light has increased and the light source units $21_1$ and $21_2$ have lowered in performance. The operation then jumps to step T3.

(Step T2) is the Luminous Intensity of the Light Source Units Below a Preset Value?

After the lighting time is found in step T1 to have reached the preset value, the photo detector 40 detects the intensity of light emitted from the light source units $21_1$ and $21_2$. The photo detector 40 determines whether the luminous intensity is below a preset value. When the luminous intensity is below the preset value, it is determined that the luminous intensity has fallen and the light source units $21_1$ and $21_2$ have become low in performance. The operation then moves to the following step T3. When the luminous intensity equals or exceeds the preset value, the operation returns to step T1.

(Step T3) has a Next Substrate Arrived?

When the lighting time is found in step T1 to have reached the preset value, or when the luminous intensity is found in step T2 to be below the preset value, that is when the light source units $21_1$ and $21_2$ are determined low in performance, the edge exposure with the light source units $21_1$ and $21_2$ is continued until a next wafer W is received. That is, when the next wafer W has not arrived, the edge exposure is continued while the operation stands by in step T3 until arrival of the next wafer W. When the next wafer W arrives, the operation moves to step T3 noting that the wafer W has been received.

(Step T4) Switch Off the Light Source Unit to be Changed

Of the light source units $21_1$ and $21_2$, the lamp 21A of the light source unit $21_1$ to be changed is switched off.

(Step T5) Start Edge Exposure with the Remaining Light Source Unit

Substantially simultaneously with step T4, edge exposure of the next wafer W with the remaining light source unit $21_2$ is started. Immediately before the start of edge exposure, the photo detector 40 is operated to detect the intensity of light emitted from the light source unit $21_2$ in order to measure an irradiation time.

(Step T6) Change the Lamp of the Light Source Unit to be Changed.

The light source unit $21_1$ withdrawn from the edge exposure (the light source unit to be changed in FIG. 6) is changed. Specifically, the lamp 21A of the light source unit $21_1$ having become low in performance is replaced with a new lamp.

(Step T7) Switch on the New, Changed Light Source Unit

In preparation for a next edge exposing process, the new, changed light source unit $21_1$ is switched on to start lighting. In the second embodiment, the lamp of the light source unit $21_1$ is replaced with a new one in preparation for the next edge exposing process, to become the new, changed light source unit $21_1$. Where three or more light source units 21 are used for edge exposure, at least one light source unit 21 exists in addition to the light source units $21_1$ and $21_2$. This additional light source unit 21 may serve as the new, changed light source unit $21_1$. The light source unit $21_1$ is not used in edge exposure from step T7 until step T11, described hereinafter, for starting edge exposure with the new light source unit. As in the first embodiment, the shutter 22 is closed so that the light emitted from the light source unit $21_1$ is prevented from exiting the lamp house 21B to irradiate the wafer W.

(Step T8) has the Luminous Intensity of the New Light Source Unit Stabilized?

The lighting time measuring circuit 63 measures the lighting time from the startup of the light source unit $21_1$. The lighting time measuring circuit 63 also monitors whether the lighting time has reached the preset value (i.e. whether the luminous intensity has stabilized). When the lighting time is below the preset value, the operation stands by in step T8 until the lighting time reaches the preset value. When the lighting time has reached the preset value, the light source unit $21_1$ is determined to have become ready for edge exposure with a passage of time from the startup. Then, the operation moves to step T9.

(Step T9) has a Next Substrate Arrived?

When the lighting time is found in step T8 to have reached the preset value, that is when the light source unit $21_1$ is determined to be in the ready state, the edge exposure with the light source unit $21_2$ is continued until a next wafer W is received. That is, when the next wafer W has not arrived, the edge exposure is continued while the operation stands by in step T9 until arrival of the next wafer W. When the next wafer W arrives, the operation moves to step T10 noting that the wafer W has been received.

(Step T10) Switch Off the Light Source Unit to be Changed.

The lamp 21A of the light source unit $21_2$ having become low in performance (i.e. the light source unit to be changed in FIG. 7) is switched off.

(Step T11) Start Edge Exposure with the New Light Source Unit.

Substantially simultaneously with step T10, edge exposure of the next wafer W with the new light source unit $21_1$ is started. Immediately before the start of edge exposure, the photo detector 40 is operated to detect the intensity of light emitted from the light source unit $21_1$ in order to measure an irradiation time.

(Step T12) Change the Lamp of the Light Source Unit to be Changed.

The lamp 21A of the light source unit $21_2$ withdrawn from the edge exposure (the light source unit to be changed in FIG. 7) is replaced with a new lamp.

(Step T13) Switch on the New, Changed Light Source Unit.

In preparation for a next edge exposing process, the new, changed light source unit $21_2$ is switched on to start lighting. As described in relation to step T7, where three or more light source units 21 are used for edge exposure, at least one light source unit 21 exists in addition to the light source units $21_1$ and $21_2$. This additional light source unit 21 may serve as the new, changed light source unit $21_2$. As in step T7, the shutter 22 is closed so that the light emitted from the light source unit $21_2$ is prevented from exiting the lamp house 21B to irradiate the wafer W.

(Step T14) has the Luminous Intensity of the New Light Source Unit Stabilized?

The lighting time measuring circuit 63 measures the lighting time from the startup of the light source unit $21_1$. The lighting time measuring circuit 63 also monitors whether the lighting time has reached the preset value (i.e. whether the luminous intensity has stabilized). When the lighting time is below the preset value, the operation stands by in step T14 until the lighting time reaches the preset value. When the lighting time has reached the preset value, the light source unit $21_2$ is determined to have become ready for edge exposure with a passage of time from the startup. Then, the operation moves to step T15. This procedure is the same as in step T8.

(Step T15) has a Next Substrate Arrived?

When the lighting time is found in step T14 to have reached the preset value, that is when the light source unit 212 is determined to be in the ready state, the edge exposure with the light source unit $21_1$ is continued until a next wafer W is received. That is, when the next wafer W has not arrived, the edge exposure is continued while the operation stands by in step T15 until arrival of the next wafer W. When the next wafer W arrives, the operation moves to step T16 noting that the wafer W has been received.

(Step T16) Start Edge Exposure with the Two Light Source Units.

Edge exposure of the next wafer W is started with the two light source units 21 by adding the new light source unit $21_2$ to the other light source unit $21_1$. Immediately before the start of edge exposure, the photo detector 40 is operated to detect the intensity of light emitted from the light source unit $21_2$ in order to measure an irradiation time.

As described above, the second embodiment provides the photo detector 40 and lighting time measuring circuit 63 for detecting a decrease in performance of the light source units 21. This is effective to avoid a situation where the light source units 21 fall in performance to the extent of causing trouble in edge exposure. Also where, as in the second embodiment, edge exposure is performed by light emission from both of the light source units, the photo detector 40 and lighting time measuring circuit 63 detect a decrease in performance before the light source units $21_1$ and $21_2$ fall in performance to the extent of causing trouble in edge exposure. As in step T4, the edge exposure with the light source unit $21_1$ to be changed is stopped, thereby avoiding a situation where the remaining light source unit $21_2$ also lowers in performance so that edge exposure becomes impossible. This reduces the chance of delays occurring with the edge exposure.

The invention provides the ready state detecting device for detecting the light source unit $21_1$ or $21_2$ being in a ready state capable of edge exposure. In the second embodiment, the lighting time measuring circuit 63 serves also as the ready state detecting device. When, as in step T7, the new, changed light source unit $21_1$ is switched on to start lighting, and as in step T8, the lighting time measuring circuit 63 detects the ready state of the new light source unit $21_1$, step S11 is executed to start edge exposure with the new light source unit $21_1$. This avoids a lowering in the quality of wafer W due to an edge exposure performed with a light source unit not in the ready state yet.

The same steps may be repeated once again with respect to the light source unit 212, to change the light source unit $21_2$ to a new light source unit $21_2$ in succession. In this way, the light source units $21_1$ and $21_2$ having lowered in performance may both be changed.

In the second embodiment, the light mixing optical element 24A mixes the lights, and the photo detector 40 detects the mixed light. It may therefore be difficult to determine which of the light source units $21_1$ and $21_2$ has lowered in performance. It is also possible that the light source unit having lowered in performance may be the light source unit $21_2$ besides the light source unit $21_1$ (that is both the light source units $21_1$ and $21_2$ have lowered in performance). Thus, when a light source unit having lowered in performance is included in a set of remaining light source units 21, or when a light source unit having lowered in performance cannot be identified, the light source units $21_1$ and $21_2$ having lowered in performance are all changed to reduce delays in edge exposure, and to effect a smooth switching of the light source units having lowered in performance.

In the second embodiment, as in first embodiment, the photo detector 40 and lighting time measuring circuit 63 are used for detecting a decrease in performance of the light source units 21. The lighting time measuring circuit 63 is used for detecting the ready state of the light source units 21.

Third Embodiment

The third embodiment of this invention will be described next with reference to the drawings.

Figure 10:
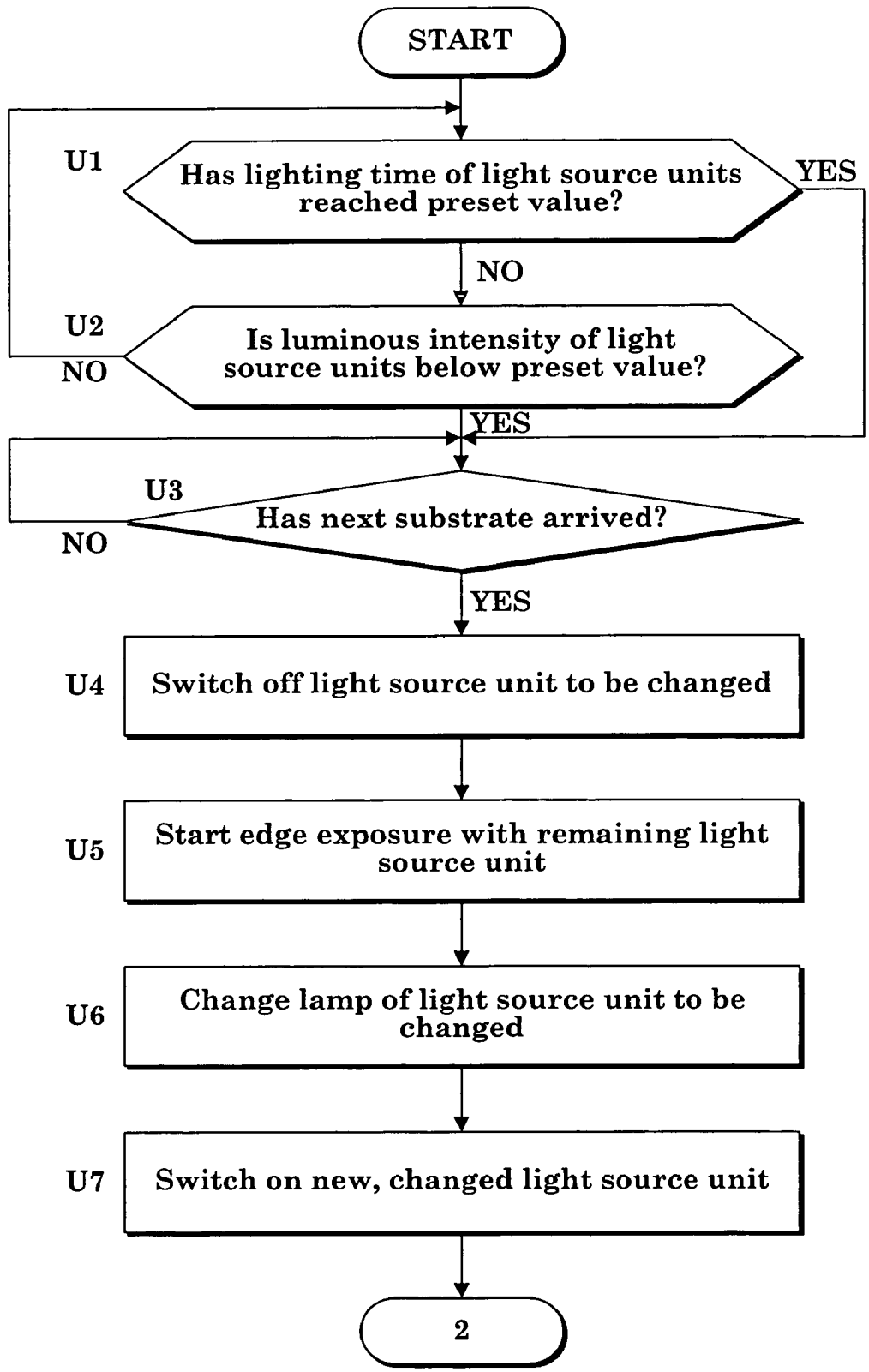
FIG. 10 is a flow chart of an edge exposing operation in the third embodiment.
Figure 11:
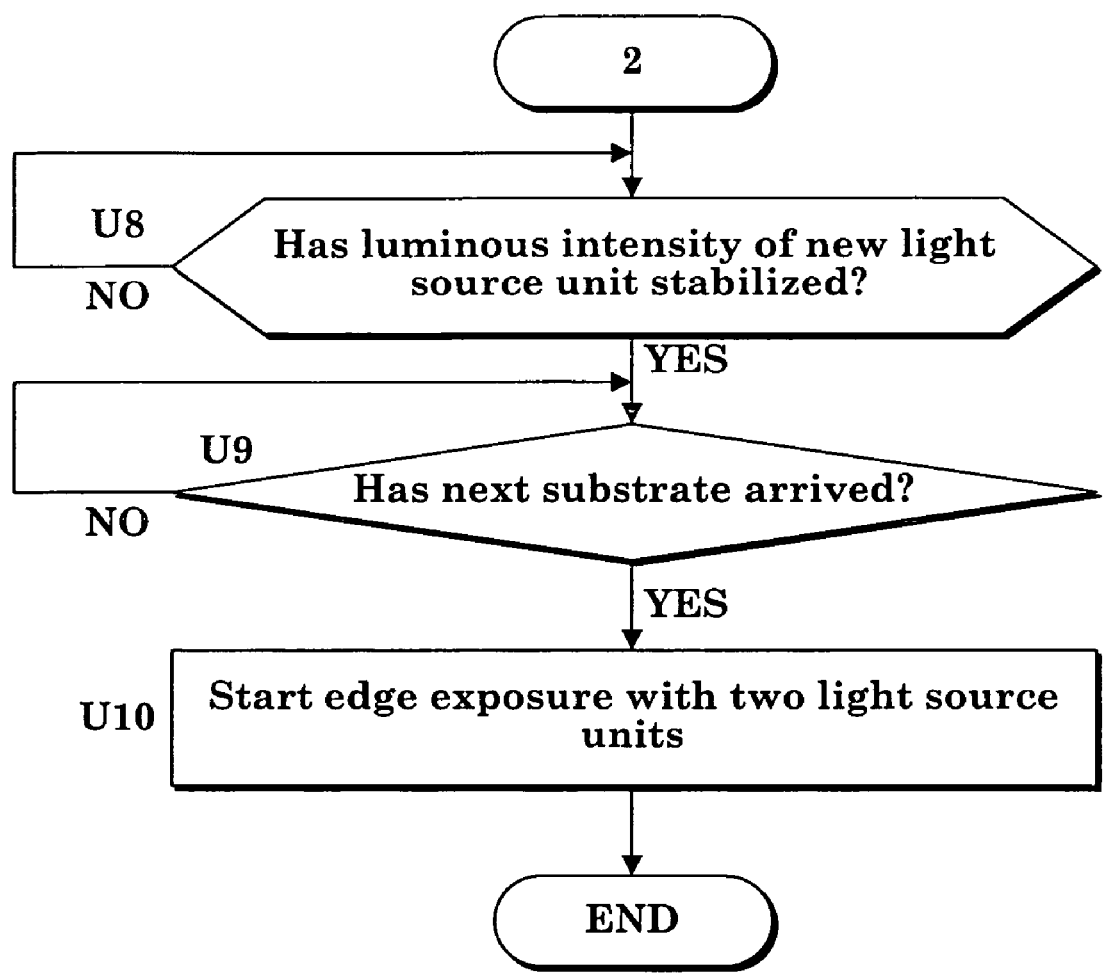
FIG. 11 is a flow chart of the edge exposing operation in the third embodiment.
Figure 12:
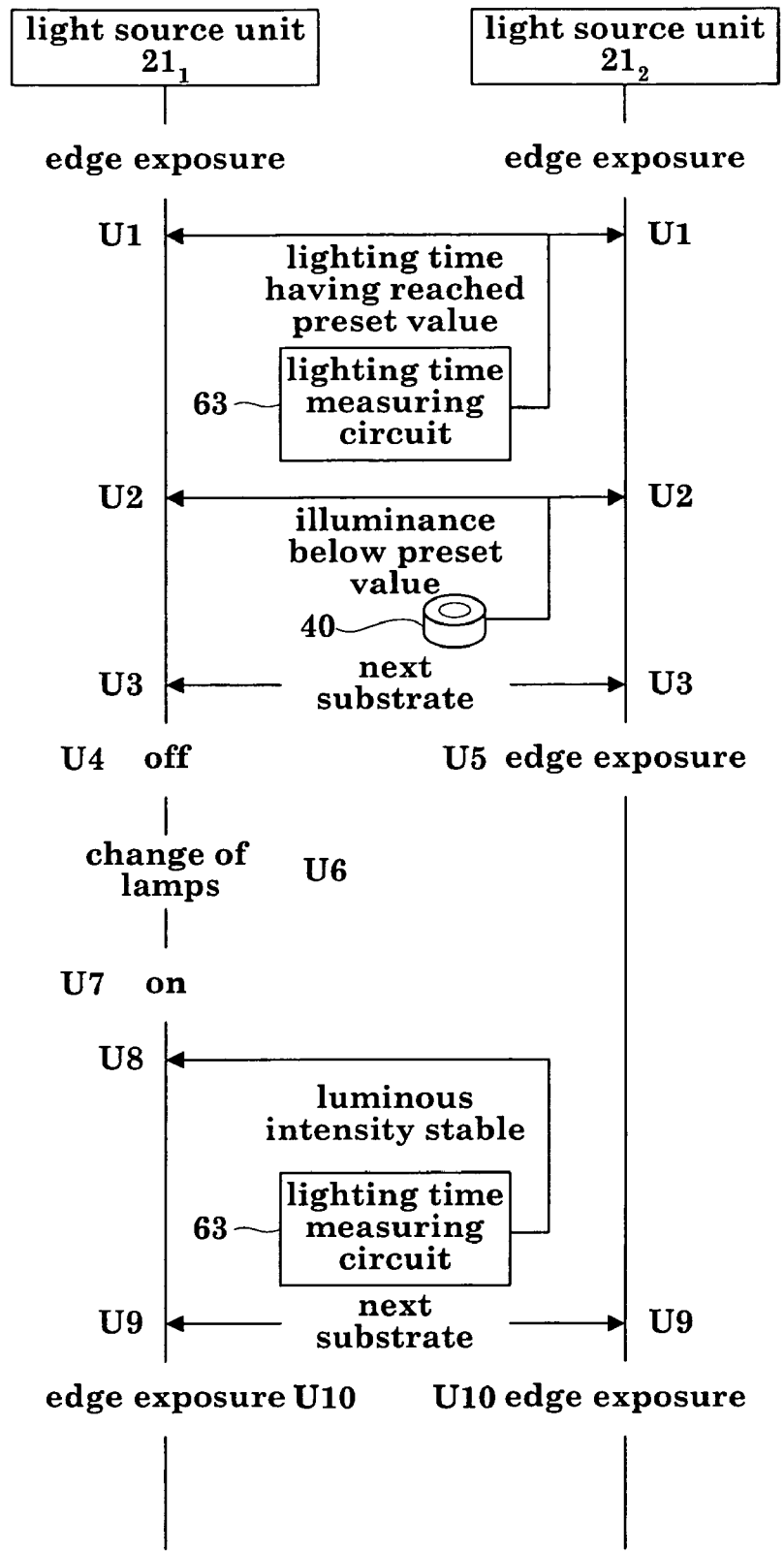
FIG. 12 is a timing chart of the edge exposing operation in the third embodiment.

FIGS. 10 and 11 are flow charts of an edge exposing operation in the third embodiment. FIG. 12 is a timing chart of the edge exposing operation in the third embodiment. The apparatus in the third embodiment has the same construction as in the first and second embodiments, and will not be described again.

In the third embodiment, as in the second embodiment, an edge exposing process from start of edge exposure to switch-off is carried out with the two light source units 21. The third embodiment is useful where one of the two light source units is identified as distinguished from the other.

(Step U1) has the Lighting Time of the Light Source Units Reached a Preset Value?

While an edge exposing operation with the two light source units $21_1$ and $21_2$ is in progress, the lighting time measuring circuit 63 measures a lighting time (irradiation time) from a start of lighting (startup). The lighting time measuring circuit 63 also monitors whether the lighting time has reached a preset value. The procedure in this step is the same as in step T1 in the second embodiment.

(Step U2) is the Luminous Intensity of the Light Source Units Below a Preset Value?

After the lighting time is found in step U1 to have reached the preset value, the photo detector 40 detects the intensity of lights emitted from the light source units $21_1$ and $21_2$. The photo detector 40 determines whether the luminous intensity is below a preset value. The procedure in this step is the same as in step T2 in the second embodiment.

(Step U3) has a Next Substrate Arrived?

When the lighting time is found in step U1 to have reached the preset value, or when the luminous intensity is found in step U2 to be below the preset value, the edge exposure with the light source units $21_1$ and $21_2$ is continued until a next wafer W is received. The procedure in this step is the same as in step T3 in the second embodiment.

(Step U4) Switch Off the Light Source Unit to be Changed

Of the light source units $21_1$ and $21_2$, the lamp 21A of the light source unit 21 to be changed is switched off. It is assumed in the third embodiment that the lighting time of the light source unit $21_1$ is found in step U1 to have reached the preset value, and thus the light source unit $21_1$ has lowered in performance, and that the lighting time of the light source unit $21_2$ is found in step U1 to be below the preset value, and thus the light source unit $21_2$ maintains performance. Consequently, the lamp 21A of the light source unit $21_1$ is switched off.

(Step U5) Start Edge Exposure with the Remaining Light Source Unit.

Substantially simultaneously with step U4, edge exposure of the next wafer W with the remaining light source unit $21_2$ is started. The procedure in this step is the same as in step T5 in the second embodiment.

(Step U6) Change the Lamp of the Light Source Unit to be Changed.

The light source unit $21_1$ withdrawn from the edge exposure is changed. The procedure in this step is the same as in step T6 in the second embodiment.

(Step U7) Switch on the New, Changed Light Source Unit.

In preparation for a next edge exposing process, the new, changed light source unit $21_1$ is switched on to start lighting. The procedure in this step is the same as in step T7 in the second embodiment.

(Step U8) has the Luminous Intensity of the New Light Source Unit Stabilized?

The lighting time measuring circuit 63 measures the lighting time from the startup of the light source unit $21_1$. The lighting time measuring circuit 63 also monitors whether the lighting time has reached the preset value (i.e. whether the luminous intensity has stabilized). The procedure in this step is the same as in step T8 in the second embodiment.

(Step U9) has a Next Substrate Arrived?

When the lighting time is found in step U8 to have reached the preset value, the edge exposure with the light source unit $21_2$ is continued until a next wafer W is received. The procedure in this step is the same as in step T9 in the second embodiment.

(Step U10) Start Edge Exposure with the Two Light Source Units.

The third embodiment is described on the assumption that the light source unit $21_2$ becomes low in performance. Unlike the second embodiment, this embodiment does not require a stopping of the light emission from the light source unit $21_2$. Edge exposure of the next wafer W is started with the two light source units 21 by adding the light source unit $21_1$ to the other light source unit $21_2$.

As described above, the third embodiment, as does the second embodiment, provides the photo detector 40 and lighting time measuring circuit 63 for detecting a decrease in performance of the light source units 21. This is effective to avoid a situation where the light source units 21 fall in performance to the extent of causing trouble in edge exposure. Also where, as in the third embodiment, edge exposure is performed by light emission from both of the light source units, the photo detector 40 and lighting time measuring circuit 63 detect a decrease in performance before the light source unit $21_1$ and $21_2$ fall in performance to the extent of causing trouble in edge exposure. As in step U4, the edge exposure with the light source unit $21_1$ to be changed is stopped, thereby avoiding a situation where the remaining light source unit $21_2$ also lowers in performance so that edge exposure becomes impossible. This reduces the chance of delays occurring with the edge exposure.

When, as in step U7, the new, changed light source unit $21_1$ is switched on to start lighting, and as in step U8, the lighting time measuring circuit 63 detects the ready state of the new light source unit $21_1$, step U10 is executed to start edge exposure with the two light source units 21 by adding the new light source unit $21_1$ to the other light source unit $21_2$. This avoids a lowering in the quality of wafer W due to an edge exposure performed with a light source unit not in the ready state yet. As noted hereinbefore, the third embodiment is useful where one of the two light source units (e.g. the light source unit $21_1$) is identified as distinguished from the other.

While the third embodiment uses two light source units 21, the same results are obtained from use of three or more light source units 21. For example, edge exposure is carried out with three light source units 21, one of the light source units 21 having lowered in performance is stopped operating, and the edge exposure is continued with the remaining set of light source units 21. The new, changed light source unit 21 is started, and when the new light source unit 21 is detected to be in the ready state, the new light source unit 21 is added to the remaining set of light source units 21. Edge exposure is now performed with these light source units 21.

Fourth Embodiment

The fourth embodiment of this invention will be described next with reference to the drawings.

Figure 13:
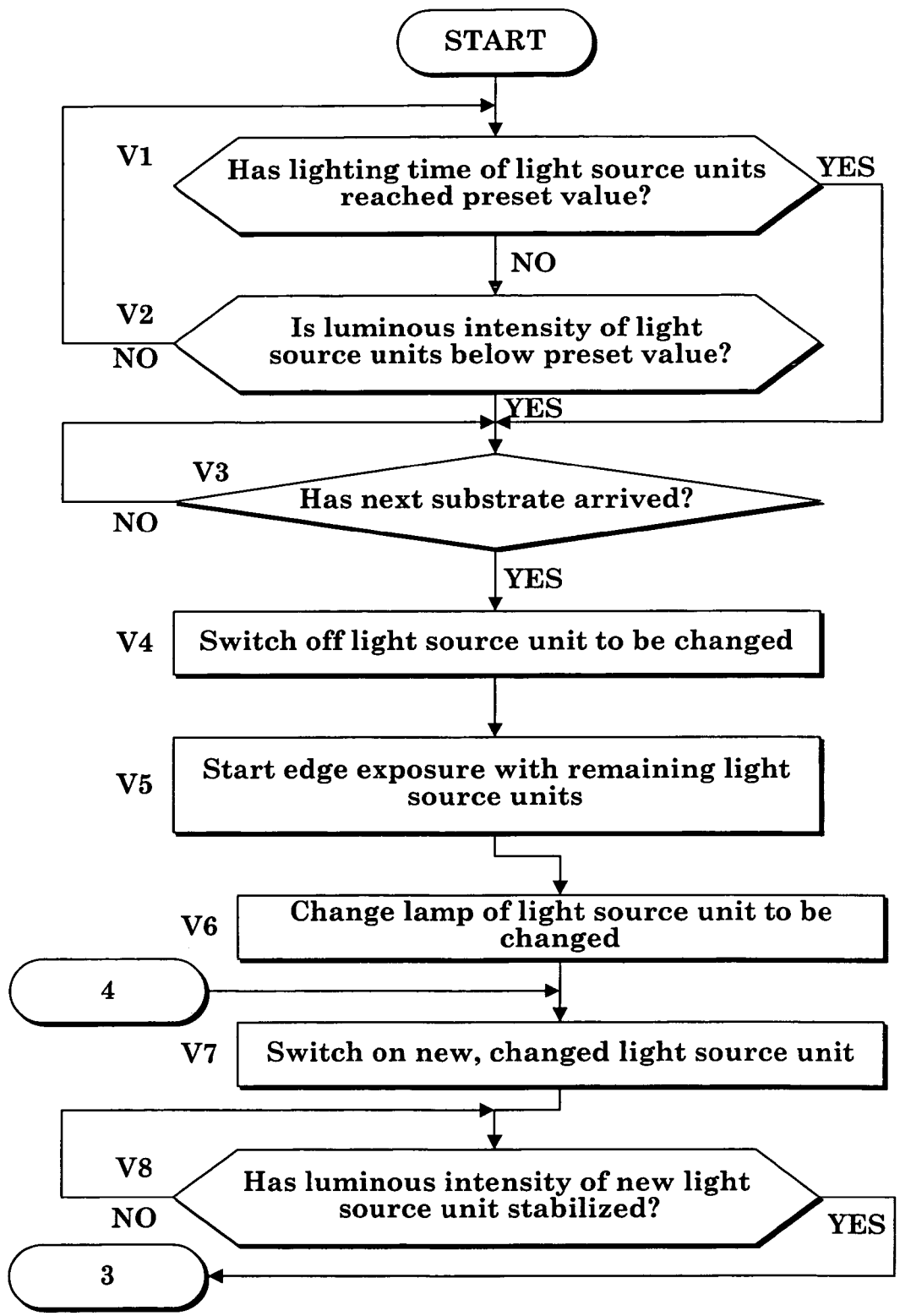
FIG. 13 is a flow chart of an edge exposing operation in a fourth embodiment.
Figure 14:
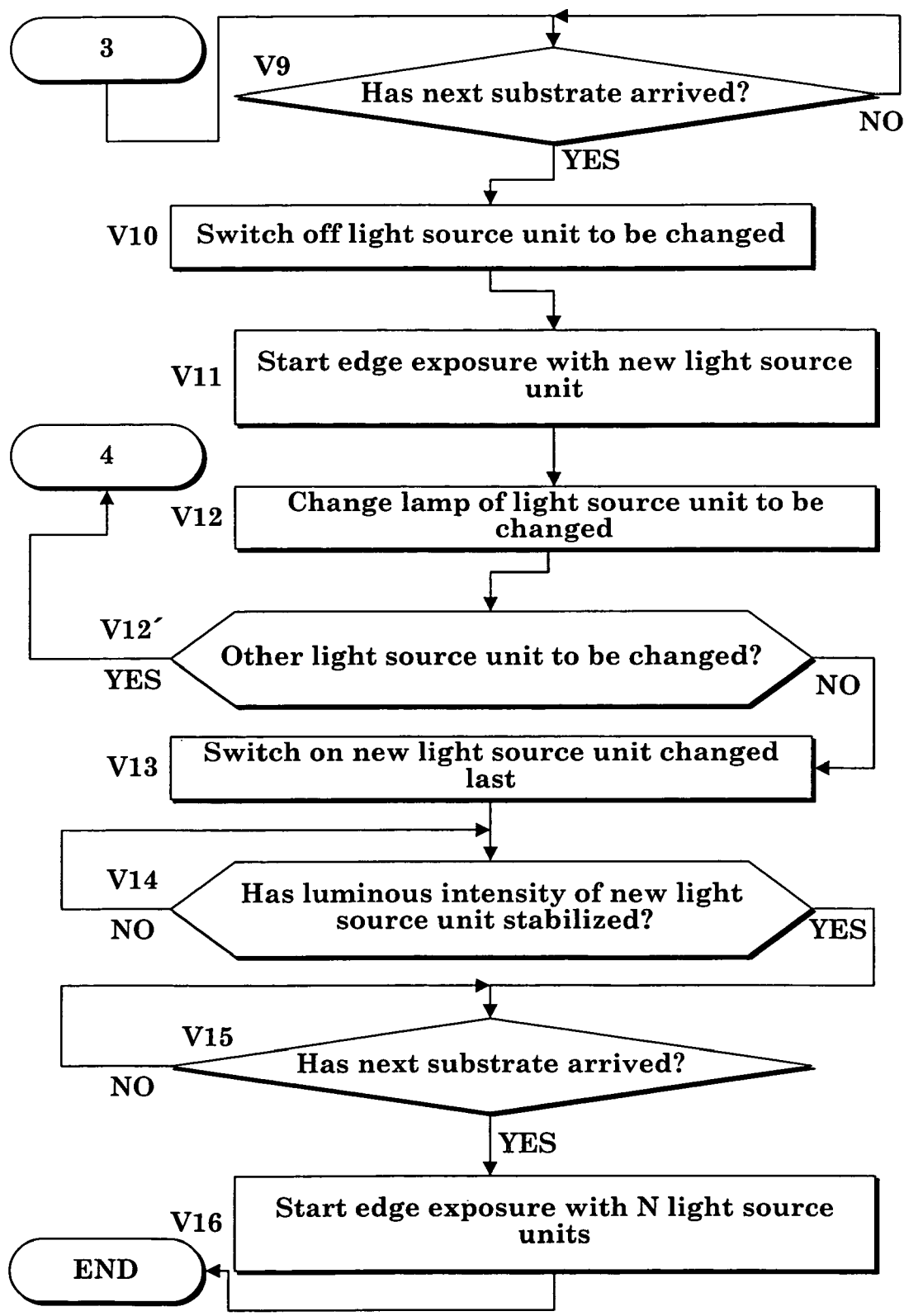
FIG. 14 is a flow chart of the edge exposing operation in the fourth embodiment.
Figure 15:
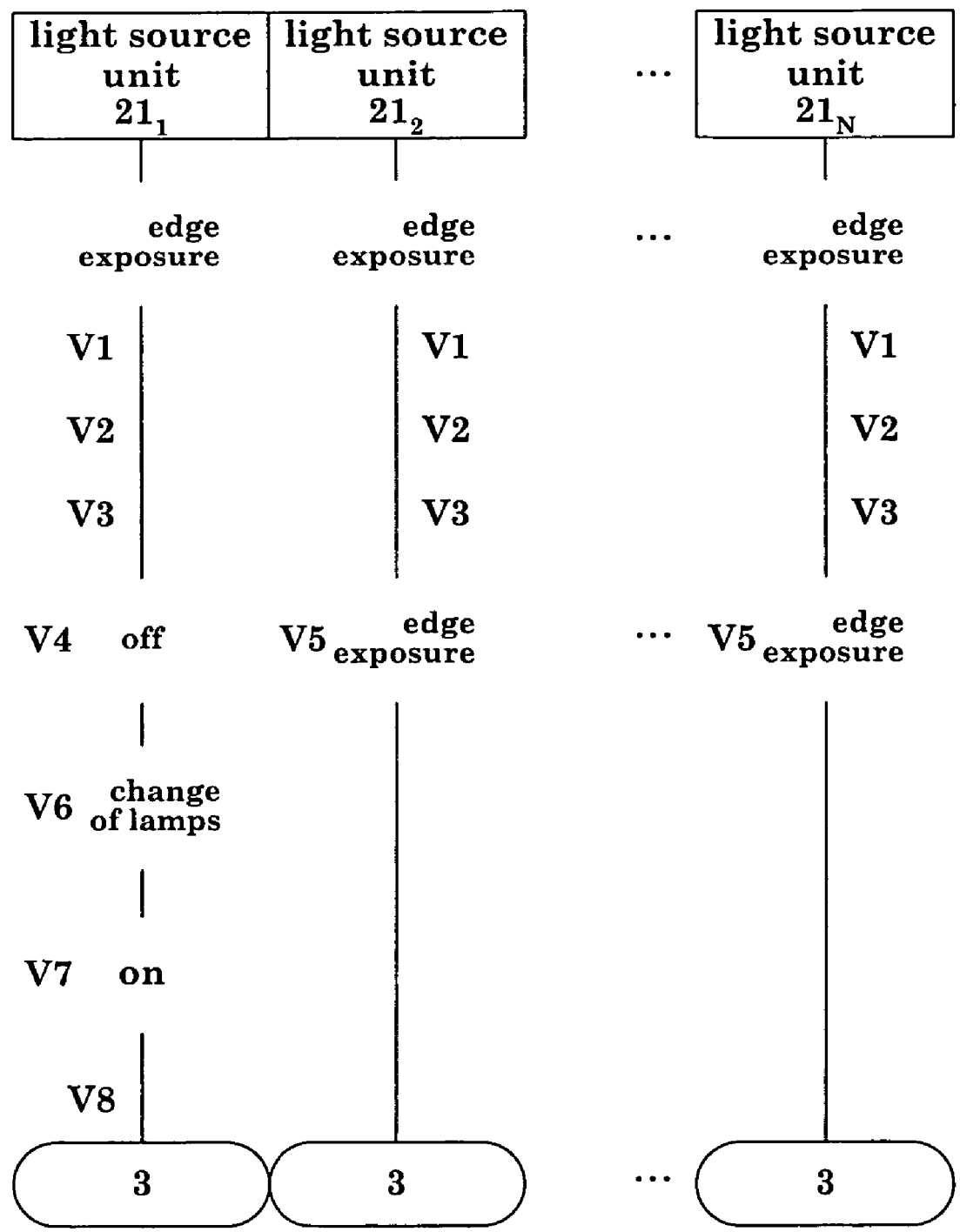
FIG. 15 is a timing chart of the edge exposing operation in the fourth embodiment.
Figure 16:
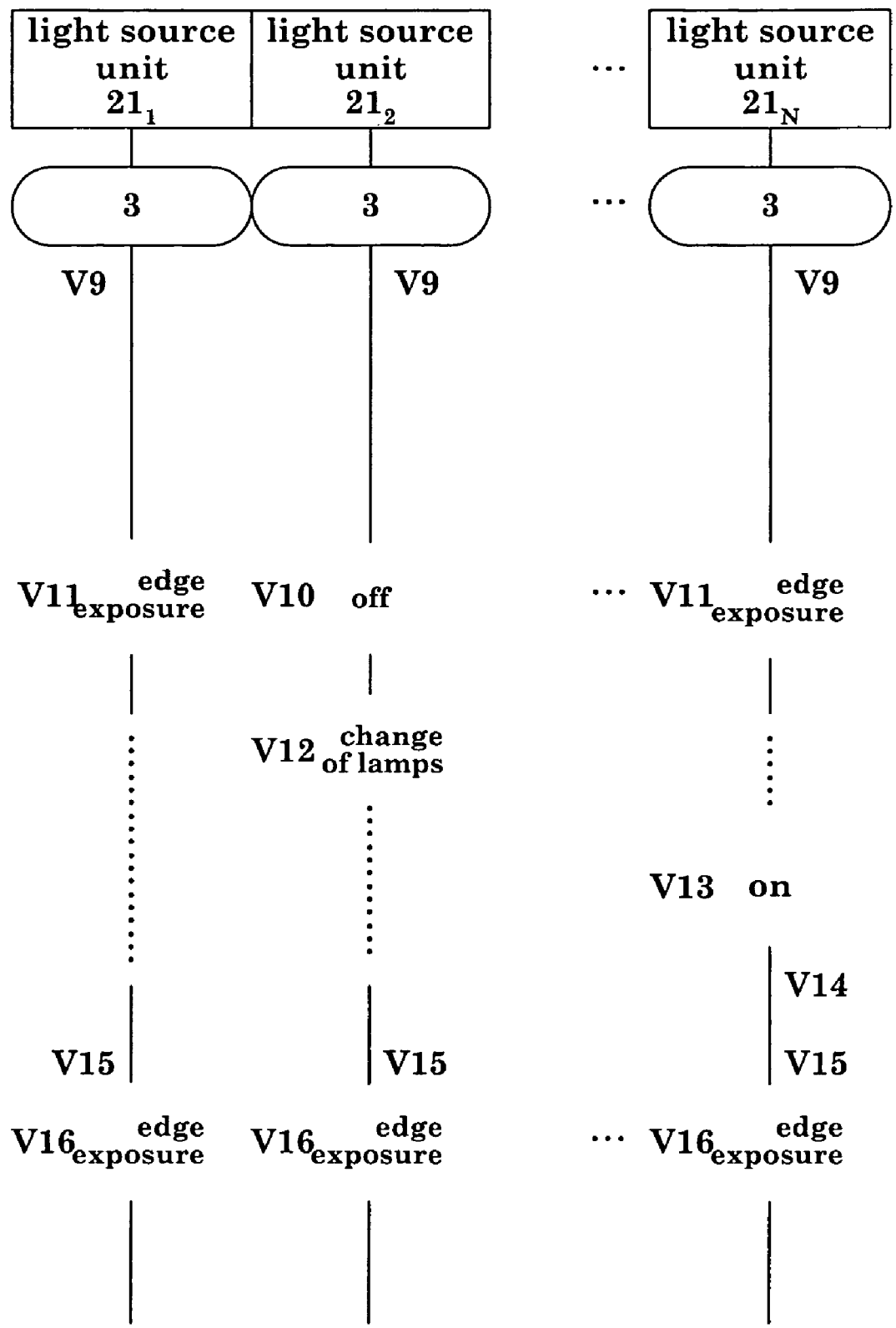
FIG. 16 is a timing chart of the edge exposing operation in the fourth embodiment.

FIGS. 13 and 14 are flow charts of an edge exposing operation in the fourth embodiment. FIGS. 15 and 16 are timing charts of the edge exposing operation in the fourth embodiment.

The fourth embodiment provides at least three light source units, and an edge exposing process from start of edge exposure to switch-off is carried out with the light source units 21, N in number (at least three). The light source units 21 will be referred to as "light source unit $21_1$", "light source unit $21_2$", "light source unit $21_3$" and "light source unit $21_N$" in order. The light source units 21 are each changed to a new one in the above order. In the fourth embodiment, the lights emitted from the light source units $21_1$, $21_2$, $21_3$ and $21_N$ are mixed by the light mixing optical element 24A. The mixed light is used to irradiate the edge regions of wafer W to perform edge exposure.

(Step V1) has the Lighting Time of the Light Source Units Reached a Preset Value?

While an edge exposing operation with the two light source units $21_1$, $21_2$, $21_3$ and $21_N$ is in progress, the lighting time measuring circuit 63 measures a lighting time. The lighting time measuring circuit 63 also monitors whether the lighting time has reached a preset value. The procedure in this step is the same as in step T1 in the second embodiment except the number of light source units 21.

(Step V2) is the Luminous Intensity of the Light Source Units Below a Preset Value?

After the lighting time is found in step V1 to have reached the preset value, the photo detector 40 detects the intensity of lights emitted from the light source units $21_1$, $21_2$, . . . and $21_N$. The photo detector 40 determines whether the luminous intensity is below a preset value. The procedure in this step is the same as in step T2 in the second embodiment except the number of light source units 21.

(Step V3) has a Next Substrate Arrived?

When the lighting time is found in step V1 to have reached the preset value, or when the luminous intensity is found in step V2 to be below the preset value, the edge exposure with the light source units $21_1$, $21_2$, . . . and $21_N$ is continued until a next wafer W is received. The procedure in this step is the same as in step T3 in the second embodiment except the number of light source units 21.

(Step V4) Switch Off the Light Source Unit to be Changed

Of the light source units $21_1$, $21_2$, . . . and $21_N$, the lamp 21A of the light source unit $21_1$ to be changed is switched off.

(Step V5) Start Edge Exposure with the Remaining Light Source Units

Substantially simultaneously with step V4, edge exposure of the next wafer W with the remaining light source units $21_2$, . . . and $21_N$ is started.

(Step V6) Change the Lamp of the Light Source Unit to be Changed.

The light source unit $21_1$ withdrawn from the edge exposure is changed. The procedure in this step is the same as in step T6 in the second embodiment.

(Step V7) Switch on the New, Changed Light Source Unit.

In preparation for a next edge exposing process, the new, changed light source unit $21_1$ is switched on to start lighting. The procedure in this step is the same as in step T7 in the second embodiment.

(Step V8) has the Luminous Intensity of the New Light Source Unit Stabilized?

The lighting time measuring circuit 63 measures the lighting time from the startup of the light source unit $21_1$. The lighting time measuring circuit 63 also monitors whether the lighting time has reached the preset value (i.e. whether the luminous intensity has stabilized). The procedure in this step is the same as in step T8 in the second embodiment.

(Step V9) has a Next Substrate Arrived?

When the lighting time is found in step V8 to have reached the preset value, the edge exposure with the light source units $21_2, \ldots$ and $21_N$ is continued until a next wafer W is received. The procedure in this step is the same as in step T9 in the second embodiment.

(Step V10) Switch Off the Light Source Unit to be Changed.

Of the light source units $21_2, \ldots$ and $21_N$, the lamp 21A of the light source unit $21_2$ having become low in performance (i.e. the light source unit to be changed in FIG. 14) is switched off.

(Step V11) Start Edge Exposure with the New Light Source Unit.

Substantially simultaneously with step V10, edge exposure of the next wafer W is started with the light source units $21_1, 21_2, \ldots$ and $21_N$ by adding the light source unit $21_1$ to the set of remaining light source units $21_3, \ldots 21_N$.

(Step V12) Change the Lamp of the Light Source Unit to be Changed.

The lamp 21A of the light source unit $21_2$ withdrawn from the edge exposure is replaced with a new lamp. The procedure in this step is the same as in step T12.

(Step V12') Other Light Source Unit to be Changed?

The procedure from step V7 to step V12 and step V12' is repeated a plurality of times. Specifically, the light source unit 21 to be changed is switched off to withdraw from the edge exposure (step V10), the edge exposure is continued with the set of remaining light source units 21 (step V11), the new light source unit 21 changed at step V12 is switched on to start lighting (step V7), and when the ready state of the new light source unit 21 is detected (step V8), this light source unit 21 is added to the set of light source units 21 to perform edge exposure with these light source units 21 (steps V9 and V11). The above series of steps is repeated until no light source unit 21 remains to be changed. The fourth embodiment repeats the procedure from step V7 to step V12 and step V12' until the light source unit $21_N$ is changed to a new one as noted above.

(Step V13) Switch on the New Light Source Unit Changed Last.

In preparation for a next edge exposing process, the light source unit $21_N$ changed last is switched on to start lighting.

(Step V14) has the Luminous Intensity of the New Light Source Unit Stabilized?

The lighting time measuring circuit 63 measures the lighting time from the startup of the light source unit $21_N$. The lighting time measuring circuit 63 also monitors whether the lighting time has reached the preset value (i.e. whether the luminous intensity has stabilized).

(Step V15) Has a Next Substrate Arrived?

When the lighting time is found in step V14 to have reached the preset value, the edge exposure with the light source unit $21_1, 21_2, 21_3$ and $21_N$ is continued until a next wafer W is received.

(Step V16) Start Edge Exposure with the Light Source Units, N in Number.

The light source unit $21_N$ is added to the set of remaining light source units $21_1, 21_2, 21_3$ and $21_{N-1}$, and edge exposure of the next wafer W is started with the these light source units 21.

As is clear from the description of the fourth embodiment, the edge exposing procedure in the fourth embodiment is carried out with the light source units, N in number. This is a development from the edge exposing procedure in the second embodiment carried out with two light source units.

This invention is not limited to the above embodiments, but may be modified as follows:

(1) In the first to fourth embodiments described above, the time measuring device represented by the lighting time measuring circuit 63 is used as the ready state detecting device for detecting the light source units 21 being in the ready state capable of edge exposure. The following device may be used as the ready state detecting device instead.

For example, the photo detector 40 for detecting a decrease in performance (i.e. the performance decrease detecting device in this invention) is used for detecting the ready state. That is, the photo detector 40 detects luminous intensity having stabilized at or above a preset value after a switch-on. It is determined that the ready state is attained when the luminous intensity has increased beyond the above preset value to the extent of being capable of edge exposure.

Where, as in the first to fourth embodiments, mixed light is used to effect edge exposure, the photo detector 40 detects the mixed light, and the shutter 22 is closed in time of starting lighting, the photo detector 40 (FIG. 1) in the illustrated position in the first to fourth embodiments cannot detect the intensity of light from the light source unit 21 in the shielded state. In this case, a photo detector 40 may be disposed also in each light source unit 21 to detect the ready state (i.e. stabilization of luminous intensity).

(2) In the first to fourth embodiments described above, the time measuring device represented by the lighting time measuring circuit 63 and the luminous intensity detecting device represented by the photo detector 40 are used as the performance decrease detecting device for detecting a decrease in performance of the light source units 21. The following devices may be used as the performance decrease detecting device instead.

Figure 17A:
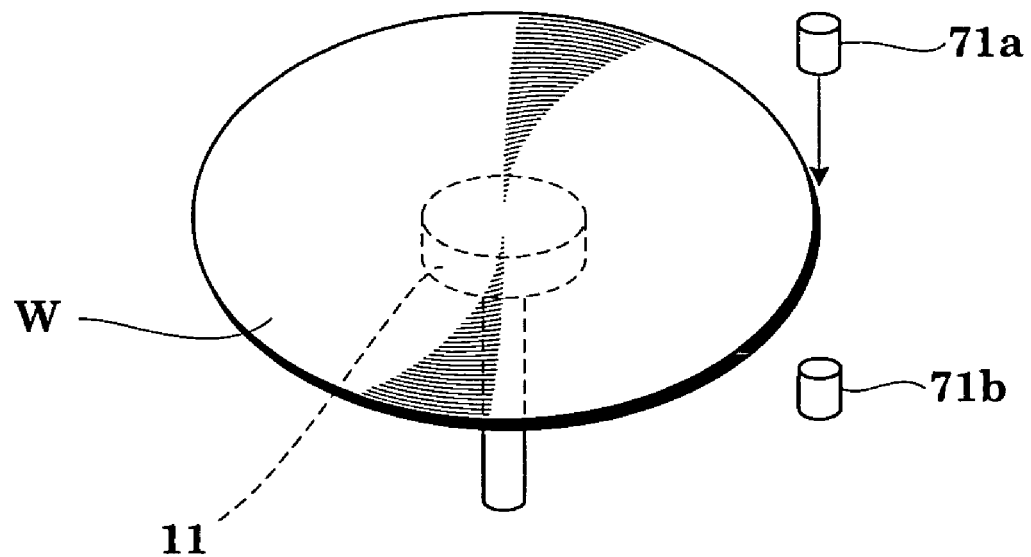
FIG. 17A is a view showing an outline of a transmission type optical sensor.
Figure 17B:
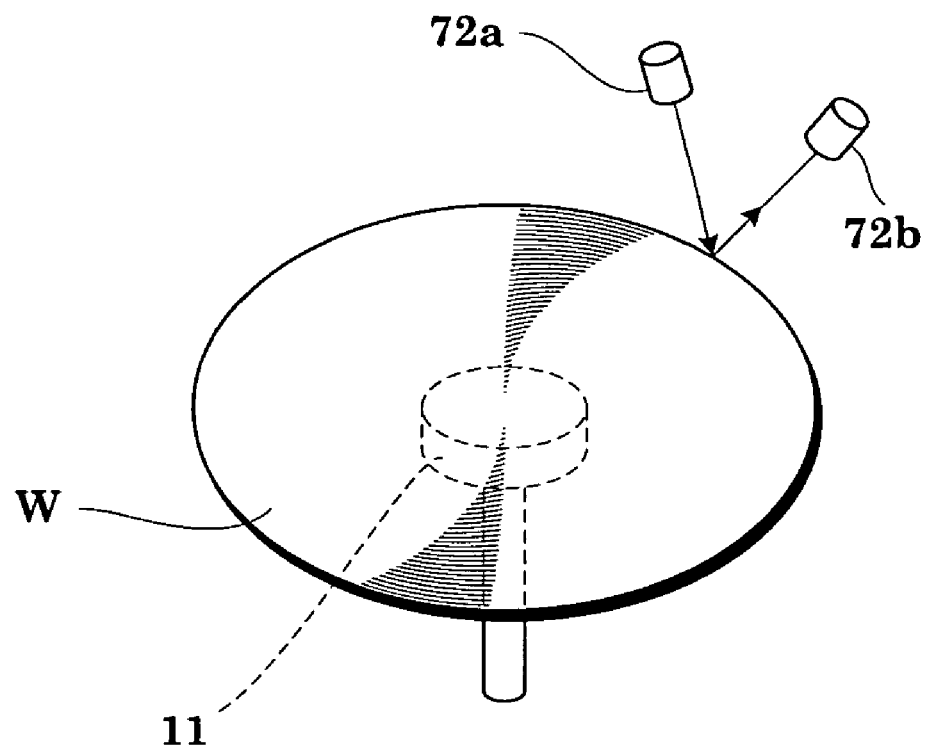
FIG. 17B is a view showing an outline of a reflection type optical sensor.

For example, a substrate counting device for counting the number of wafers W having undergone edge exposure is used for detecting a decrease in performance. Typical devices for counting wafers W are a transmission type optical sensor and a reflection type optical sensor, for example. A transmission type optical sensor, as shown in FIG. 17A, includes a projector 71a disposed adjacent the spin chuck 11, and a receiver 71b opposed to the projector 71a across edge regions of wafer W. When no wafer W is present on the spin chuck 11, the light emitted from the projector 71a is received by the receiver 71b. In this state, no increment is made to the count. When a wafer W is present on the spin chuck 11, the edge regions of the wafer W intercept the light emitted from the projector 71a. In this state where the receiver 71b does not receive the light, the count is incremented by one. In the case of a reflection type optical sensor, as shown in FIG. 17B, a projector 72a and a receiver 72b are arranged at the same side adjacent the spin chuck 11. When no wafer W is present on the spin chuck 11, the light emitted from the projector 72a is not reflected. In this state where the receiver 72b cannot receive the light, no increment is made to the count. When a wafer W is present on the spin chuck 11, the edge regions of wafer W reflect the light emitted from the projector 72a, and the receiver 72b receives the reflected light. Then, the count is incremented by one. In this way, the number of wafers W is counted when each wafer W is loaded for edge exposure. The substrate counting device is not limited to the optical sensors described above. For example, a contact sensor that counts wafers W by contacting the wafers W may be employed as long as this imparts no influence on the treatment of wafers W.

The substrate counting device represented by the transmission type optical sensor and reflection type optical sensor determines that, with an increase in the number of wafers W having undergone edge exposure, an integrated quantity of light has increased and the light source units have lowered in performance.

(3) In the first to fourth embodiments described above, a decrease in performance is detected by using both the measurement of lighting time by the lighting time measuring circuit 63 and the detection of luminous intensity by the photo detector 40. Instead, only the measurement of lighting time or detection of luminous intensity may be used. The decrease in performance may be detected by additionally combining a coefficient of the number of substrates. The decrease in performance may be detected by using only a coefficient of the number of substrates. The decrease in performance may be detected by combination of a coefficient of the number of substrates and measurement of lighting time, or combination of a coefficient of the number of substrates and detection of luminous intensity.

Similarly, while the ready state is detected by using the measurement of lighting time by the lighting time measuring circuit 63, both this measurement and the detection of luminous intensity by the photo detector 40 may be used as in modification (2) described above. Specifically, the ready state may be detected by using only the measurement of lighting time or the detection of luminous intensity, or by using both the measurement of lighting time and the detection of luminous intensity.

(4) In the first to fourth embodiments described above, the projecting lens 25B (FIG. 1) for converging bundles of rays is disposed at the end of the light mixing optical element 24A (FIG. 1) directed to the wafer W, and each bundle of rays transmitted through the projecting lens 25B is converged adjacent the edge regions of wafer W. This lens is dispensable where the bundle of rays converges without the lens, or where the edge exposure need not be precise.

Figure 18:
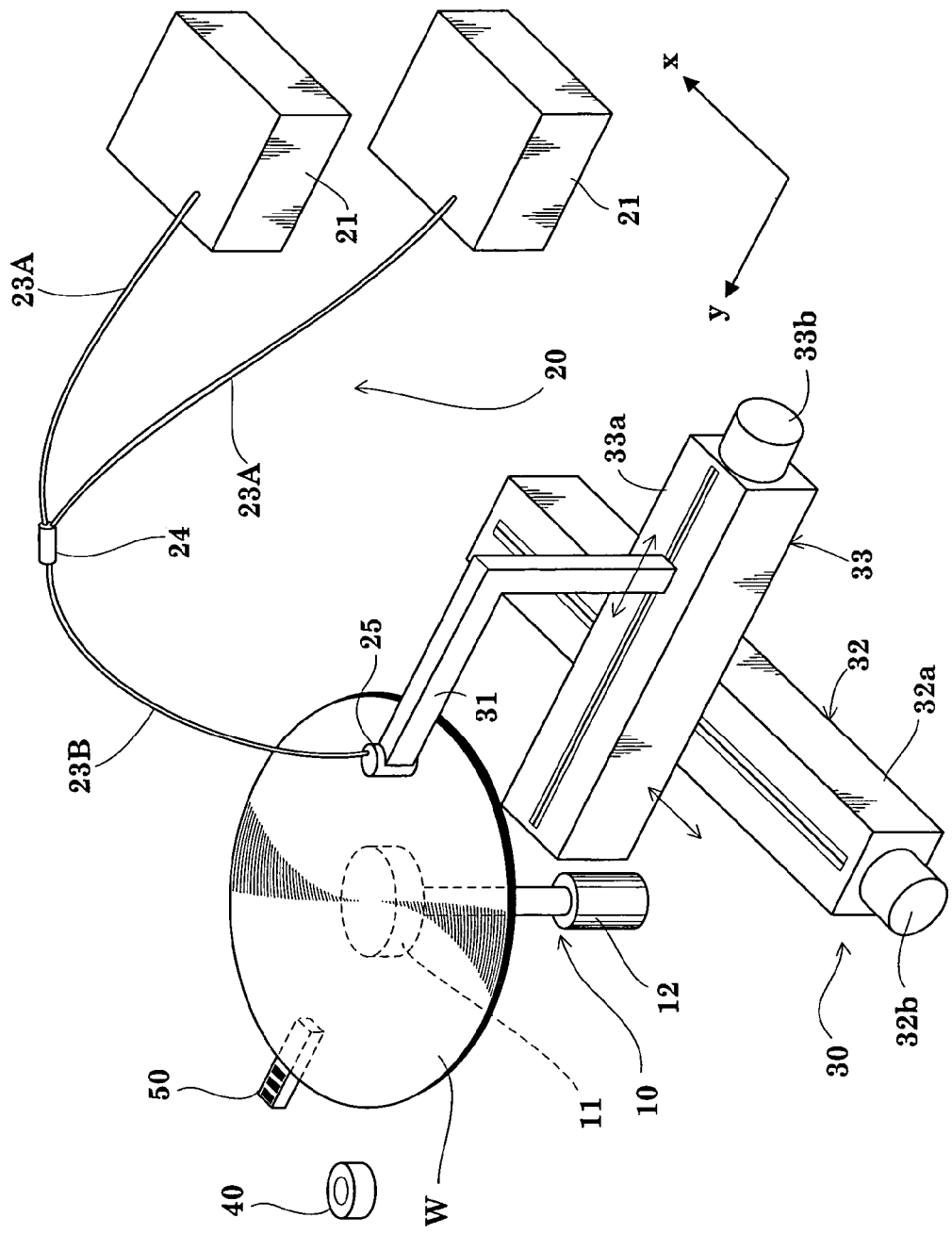
FIG. 18 is a perspective view showing an outline of a modified edge exposure apparatus.

(5) In the first to fourth embodiments described above, the apparatus directly irradiates the edge regions of wafer W with the light mixed by the light mixing optical element 24A. A second light guide may be provided at the exit side toward the wafer W as in the patent publication noted hereinbefore. That is, as shown in FIG. 18, the light guide 23 may be divided into first light guides 23A and a second light guide 23B, with a light mixing optical element 24 disposed between the first light guides 23A and the second light guide 23B. A further light mixing optical element (not shown) may be attached to the forward end of the second light guide 23B for mixing light and directly irradiating the edge regions of wafer W with the mixed light.

This invention may be embodied in other specific forms without departing from the spirit or essential attributes thereof and, accordingly, reference should be made to the appended claims, rather than to the foregoing specification, as indicating the scope of the invention.

What is claimed is:

1. An edge exposing apparatus for performing edge exposure by emitting light to edge regions of substrates, comprising:
    first and second light emitting means for emitting light;
    control means for controlling the light emitting means;
    performance decrease detecting means for detecting a decrease in performance of the light emitting means; and
    ready state detecting means for detecting the light emitting means being in a ready state capable of performing edge exposure;
    wherein, when edge exposure is effected with the light emitted from the first light emitting means, the control means executes the following steps with respect to each of the light emitting means based on a detection made by said performance decrease detecting means of the first light emitting means having lowered in performance:
    (A) continuing the edge exposure with the first light emitting means, and starting the second light emitting means; and
    (B) terminating the edge exposure with the first light emitting means, and performing edge exposure with the second light emitting means, when said ready state detecting means detects the ready state of the second light emitting means.

2. An edge exposing apparatus as defined in claim 1, wherein said performance decrease detecting means comprises time measuring means for measuring a lighting time of the light emitting means for obtaining a quantity of light required for edge exposure, the decrease in performance of the light emitting means being detected when the lighting time measured reaches a predetermined value.

3. An edge exposing apparatus as defined in claim 1, wherein said performance decrease detecting means comprises substrate counting means for counting the substrates having undergone the edge exposure, the decrease in performance of the light emitting means being detected when a count of the substrates reaches a predetermined value.

4. An edge exposing apparatus as defined in claim 1, wherein said performance decrease detecting means comprises luminous intensity detecting means for detecting luminous intensity of the light emitting means, the decrease in performance of the light emitting means being detected when the luminous intensity detected is less than a predetermined value.

5. An edge exposing apparatus as defined in claim 1, wherein said performance decrease detecting means comprises time measuring means for measuring a lighting time of the light emitting means for obtaining a quantity of light required for edge exposure, and luminous intensity detecting means for detecting luminous intensity of the light emitting means, the decrease in performance of the light emitting means being detected when the lighting time measured reaches a predetermined value, and when the luminous intensity detected is less than a predetermined value.

6. An edge exposing apparatus as defined in claim 1, wherein said ready state detecting means comprises time measuring means for measuring an elapsed time from a startup of the light emitting means, the ready state of the light emitting means being detected when the elapsed time measured reaches a predetermined value.

7. An edge exposing apparatus as defined in claim 1, wherein said ready state detecting means comprises luminous intensity detecting means for detecting luminous intensity of the light emitting means, the ready state of the light emitting means being detected when the luminous intensity detected reaches a predetermined value.

8. An edge exposing apparatus as defined in claim 7, wherein, when said ready state detecting means comprises said luminous intensity detecting means, said luminous intensity detecting means is disposed in each of said light emitting means.

9. An edge exposing apparatus for performing edge exposure by emitting light to edge regions of substrates, comprising:
   a plurality of light emitting means for emitting light;
   control means for controlling the light emitting means;
   performance decrease detecting means for detecting a decrease in performance of the light emitting means; and
   ready state detecting means for detecting the light emitting means being in a ready state capable of performing edge exposure;
   wherein, when edge exposure is effected with the light emitted from all of the light emitting means, the control means executes the following steps with respect to each of the light emitting means for changing one of the light emitting means based on a detection made by said performance decrease detecting means of the light emitting means having lowered in performance:
   (a) stopping the edge exposure with the light emitting means to be changed, and continuing the edge exposure with a set of remaining light emitting means; and
   (b) starting new, changed light emitting means, adding the new, changed light emitting means to said set of remaining light emitting means when said ready state detecting means detects the ready state of the new, changed light emitting means, and performing edge exposure with the new, changed light emitting means and the remaining light emitting means.

10. An edge exposing apparatus as defined in claim 9, wherein said steps (a) and (b) are repeated a plurality of times to change successively a required number of the light emitting means to new light emitting means.

11. An edge exposing apparatus as defined in claim 9, wherein said performance decrease detecting means comprises time measuring means for measuring a lighting time of the light emitting means for obtaining a quantity of light required for edge exposure, the decrease in performance of the light emitting means being detected when the lighting time measured reaches a predetermined value.

12. An edge exposing apparatus as defined in claim 9, wherein said performance decrease detecting means comprises substrate counting means for counting the substrates having undergone the edge exposure, the decrease in performance of the light emitting means being detected when a count of the substrates reaches a predetermined value.

13. An edge exposing apparatus as defined in claim 9, wherein said performance decrease detecting means comprises luminous intensity detecting means for detecting luminous intensity of the light emitting means, the decrease in performance of the light emitting means being detected when the luminous intensity detected is less than a predetermined value.

14. An edge exposing apparatus as defined in claim 9, wherein said performance decrease detecting means comprises time measuring means for measuring a lighting time of the light emitting means for obtaining a quantity of light required for edge exposure, and luminous intensity detecting means for detecting luminous intensity of the light emitting means, the decrease in performance of the light emitting means being detected when the lighting time measured reaches a predetermined value, and the luminous intensity detected is less than a predetermined value.

15. An edge exposing apparatus as defined in claim 9, wherein said ready state detecting means comprises time measuring means for measuring an elapsed time from a startup of the light emitting means, the ready state of the light emitting means being detected when the elapsed time measured reaches a predetermined value.

16. An edge exposing apparatus as defined in claim 9, wherein said ready state detecting means comprises luminous intensity detecting means for detecting luminous intensity of the light emitting means, the ready state of the light emitting means being detected when the luminous intensity detected reaches a predetermined value.

17. An edge exposing apparatus as defined in claim 16, wherein, when said ready state detecting means comprises said luminous intensity detecting means, said luminous intensity detecting means is disposed in each of said light emitting means.

18. An edge exposing apparatus for performing edge exposure by emitting light to edge regions of substrates, comprising:
   a plurality of light emitting means for emitting light;
   a plurality of light guide means optically connected in a one-to-one relationship to ends of the light emitting means; and
   a light mixing optical element optically connected to other ends of the light guide means;
   wherein the light mixing optical element is arranged to irradiate the edge regions of each substrate directly with light mixed by the light mixing optical element.

19. An edge exposing apparatus as defined in claim 18, wherein said light mixing optical element includes a lens disposed adjacent an end thereof opposed to each substrate for converging bundles of rays, said lens being arranged to converge each bundle of rays transmitted therethrough adjacent the edge regions of each substrate.

* * * * *